(12) United States Patent
Trudeau et al.

(10) Patent No.: US 10,028,399 B2
(45) Date of Patent: Jul. 17, 2018

(54) COMPRESSOR PROTECTION MODULE

(71) Applicant: Emerson Climate Technologies, Inc., Sidney, OH (US)

(72) Inventors: Edward J. Trudeau, Covington, OH (US); Kenneth R. Barnett, Springfield, OH (US); Yogesh Shelgaonkar, Pune (IN); Manoj Pralhad Khairnar, Pune (IN)

(73) Assignee: Emerson Climate Technologies, Inc., Sidney, OH (US)

( * ) Notice: Subject to any disclaimer, the term of this patent is extended or adjusted under 35 U.S.C. 154(b) by 15 days.

(21) Appl. No.: 15/099,071

(22) Filed: Apr. 14, 2016

(65) Prior Publication Data

US 2016/0222956 A1 Aug. 4, 2016

Related U.S. Application Data

(63) Continuation of application No. 13/930,403, filed on Jun. 28, 2013, now Pat. No. 9,480,177.
(Continued)

(30) Foreign Application Priority Data

Mar. 13, 2013 (IN) .............................. 756MUM2013

(51) Int. Cl.
*H05K 7/20* (2006.01)
*H05K 7/02* (2006.01)
(Continued)

(52) U.S. Cl.
CPC ............... *H05K 7/02* (2013.01); *F04B 49/06* (2013.01); *F04B 49/065* (2013.01); *F04B 49/10* (2013.01);
(Continued)

(58) Field of Classification Search
CPC ............ H05K 7/02; H05K 7/023; H05K 7/10; H05K 7/1417
See application file for complete search history.

(56) References Cited

U.S. PATENT DOCUMENTS

| 1,658,861 A | 2/1928 | Slade |
| 1,658,862 A | 2/1928 | Slade |

(Continued)

FOREIGN PATENT DOCUMENTS

| CN | 1133425 A | 10/1996 |
| CN | 1297522 A | 5/2001 |

(Continued)

OTHER PUBLICATIONS

"A Practical Example of a Building's Automatic Control," cited in First Office Action from the Patent Office of the People's Republic of China dated Jun. 29, 2007, regarding Application No. 200510005907.8, including translation by CCPIT Patent and Trademark Law Office.

(Continued)

*Primary Examiner* — Anthony Q Edwards
(74) *Attorney, Agent, or Firm* — Harness, Dickey & Pierce, P.L.C.

(57) ABSTRACT

A compressor may include a shell, a terminal assembly and an electronics module. The terminal assembly may engage the shell and may include an outwardly extending conductor and a terminal fence at least partially surrounding the conductor. The electronics module may include a back plate having an opening through which the terminal fence may be received. The back plate may include an engagement feature and a spring element. The engagement feature may removably engage the terminal fence. The spring element may contact the shell and bias the back plate away from the shell.

28 Claims, 14 Drawing Sheets

Related U.S. Application Data

(60) Provisional application No. 61/676,581, filed on Jul. 27, 2012.

(51) Int. Cl.
  F04C 28/28      (2006.01)
  F04B 49/06      (2006.01)
  F04B 51/00      (2006.01)
  F04B 49/10      (2006.01)
  F04D 27/00      (2006.01)

(52) U.S. Cl.
  CPC .............. F04B 51/00 (2013.01); F04C 28/28 (2013.01); F04D 27/008 (2013.01); Y10T 29/49117 (2015.01)

(56) References Cited

U.S. PATENT DOCUMENTS

| | | |
|---|---|---|
| 2,054,542 A | 9/1936 | Hoelle |
| 2,205,051 A | 6/1940 | Schmitt |
| 2,658,185 A | 11/1953 | Hatcher |
| 2,728,060 A | 12/1955 | Doeg |
| 2,978,879 A | 4/1961 | Heidorn |
| 3,016,511 A | 1/1962 | Unger |
| 3,022,097 A | 2/1962 | Wade Seniff Russell et al. |
| 3,031,861 A | 5/1962 | McCormack |
| 3,047,696 A | 7/1962 | Heidorn |
| 3,107,843 A | 10/1963 | Finn |
| 3,170,304 A | 2/1965 | Hale |
| 3,232,519 A | 2/1966 | Long |
| 3,278,111 A | 10/1966 | Parker |
| 3,327,197 A | 6/1967 | Marquis |
| 3,339,164 A | 8/1967 | Landis et al. |
| 3,417,361 A | 12/1968 | Heller |
| 3,605,076 A | 9/1971 | Dozier |
| 3,660,718 A | 5/1972 | Pinckaers |
| 3,665,339 A | 5/1972 | Liu |
| 3,665,399 A | 5/1972 | Zehr et al. |
| 3,680,464 A | 8/1972 | Bowlby |
| 3,684,819 A | 8/1972 | Wilson |
| 3,696,321 A | 10/1972 | Cooper, Jr. |
| 3,729,949 A | 5/1973 | Talbot |
| 3,735,377 A | 5/1973 | Kaufman |
| 3,742,302 A | 6/1973 | Neill |
| 3,742,303 A | 6/1973 | Dageford |
| 3,777,240 A | 12/1973 | Neill |
| 3,783,681 A | 1/1974 | Hirt et al. |
| 3,850,496 A | 11/1974 | Hague |
| 3,873,656 A | 3/1975 | Garner |
| 3,927,712 A | 12/1975 | Nakayama |
| 3,935,519 A | 1/1976 | Pfarrer et al. |
| 3,950,962 A | 4/1976 | Odashima |
| 3,960,011 A | 6/1976 | Renz et al. |
| 3,978,382 A | 8/1976 | Pfarrer et al. |
| 3,998,068 A | 12/1976 | Chirnside |
| 4,014,182 A | 3/1977 | Granryd |
| 4,018,584 A | 4/1977 | Mullen |
| 4,024,725 A | 5/1977 | Uchida et al. |
| 4,034,570 A | 7/1977 | Anderson et al. |
| 4,038,061 A | 7/1977 | Anderson et al. |
| 4,045,973 A | 9/1977 | Anderson et al. |
| 4,046,532 A | 9/1977 | Nelson |
| 4,059,325 A | 11/1977 | Diminnie et al. |
| 4,060,716 A | 11/1977 | Pekrul et al. |
| 4,066,869 A | 1/1978 | Apaloo et al. |
| 4,090,248 A | 5/1978 | Swanson et al. |
| 4,102,394 A | 7/1978 | Botts |
| 4,104,888 A | 8/1978 | Reedy et al. |
| 4,105,063 A | 8/1978 | Bergt |
| 4,112,703 A | 9/1978 | Kountz |
| 4,120,555 A | 10/1978 | Shiflett et al. |
| 4,136,730 A | 1/1979 | Kinsey |
| 4,137,057 A | 1/1979 | Piet et al. |
| 4,137,725 A | 2/1979 | Martin |
| 4,142,375 A | 3/1979 | Abe et al. |
| 4,143,707 A | 3/1979 | Lewis et al. |
| 4,146,085 A | 3/1979 | Wills |
| RE29,966 E | 4/1979 | Nussbaum |
| 4,156,350 A | 5/1979 | Elliott et al. |
| 4,161,106 A | 7/1979 | Savage et al. |
| 4,165,619 A | 8/1979 | Girard |
| 4,171,622 A | 10/1979 | Yamaguchi et al. |
| 4,173,871 A | 11/1979 | Brooks |
| RE30,242 E | 4/1980 | del Toro et al. |
| 4,209,994 A | 7/1980 | Mueller et al. |
| 4,211,089 A | 7/1980 | Mueller et al. |
| 4,220,010 A | 9/1980 | Mueller et al. |
| 4,227,862 A | 10/1980 | Andrew et al. |
| 4,232,530 A | 11/1980 | Mueller |
| 4,233,818 A | 11/1980 | Lastinger |
| 4,236,379 A | 12/1980 | Mueller |
| 4,244,182 A | 1/1981 | Behr |
| 4,246,763 A | 1/1981 | Mueller et al. |
| 4,248,051 A | 2/1981 | Darcy et al. |
| 4,251,988 A | 2/1981 | Allard et al. |
| 4,252,394 A | 2/1981 | Miller |
| 4,257,795 A | 3/1981 | Shaw |
| 4,259,847 A | 4/1981 | Pearse, Jr. |
| 4,267,702 A | 5/1981 | Houk |
| 4,271,898 A | 6/1981 | Freeman |
| 4,286,438 A | 9/1981 | Clarke |
| 4,290,480 A | 9/1981 | Sulkowski |
| 4,301,660 A | 11/1981 | Mueller et al. |
| 4,307,775 A | 12/1981 | Saunders et al. |
| 4,311,188 A | 1/1982 | Kojima et al. |
| 4,319,299 A | 3/1982 | Woods et al. |
| 4,319,461 A | 3/1982 | Shaw |
| 4,325,223 A | 4/1982 | Cantley |
| 4,328,678 A | 5/1982 | Kono et al. |
| 4,328,680 A | 5/1982 | Stamp, Jr. et al. |
| 4,333,316 A | 6/1982 | Stamp, Jr. et al. |
| 4,333,317 A | 6/1982 | Sawyer |
| 4,336,001 A | 6/1982 | Andrew et al. |
| 4,338,790 A | 7/1982 | Saunders et al. |
| 4,338,791 A | 7/1982 | Stamp, Jr. et al. |
| 4,345,162 A | 8/1982 | Hammer et al. |
| 4,350,021 A | 9/1982 | Lundstrom |
| 4,350,023 A | 9/1982 | Kuwabara et al. |
| 4,356,703 A | 11/1982 | Vogel |
| 4,361,273 A | 11/1982 | Levine et al. |
| 4,365,983 A | 12/1982 | Abraham et al. |
| 4,370,098 A | 1/1983 | McClain et al. |
| 4,372,119 A | 2/1983 | Gillbrand et al. |
| 4,376,926 A | 3/1983 | Senor |
| 4,381,549 A | 4/1983 | Stamp, Jr. et al. |
| 4,382,367 A | 5/1983 | Roberts |
| 4,384,462 A | 5/1983 | Overman et al. |
| 4,387,368 A | 6/1983 | Day, III et al. |
| 4,390,321 A | 6/1983 | Langlois et al. |
| 4,390,922 A | 6/1983 | Pelliccia |
| 4,395,886 A | 8/1983 | Mayer |
| 4,395,887 A | 8/1983 | Sweetman |
| 4,399,548 A | 8/1983 | Castleberry |
| 4,406,133 A | 9/1983 | Saunders et al. |
| 4,407,138 A | 10/1983 | Mueller |
| 4,408,660 A | 10/1983 | Sutoh et al. |
| 4,425,010 A | 1/1984 | Bryant et al. |
| 4,429,578 A | 2/1984 | Darrel et al. |
| 4,441,329 A | 4/1984 | Dawley |
| 4,448,038 A | 5/1984 | Barbier |
| 4,449,375 A | 5/1984 | Briccetti |
| 4,460,123 A | 7/1984 | Beverly |
| 4,463,571 A | 8/1984 | Wiggs |
| 4,465,229 A | 8/1984 | Kompelien |
| 4,467,230 A | 8/1984 | Rovinsky |
| 4,467,385 A | 8/1984 | Bandali et al. |
| 4,467,613 A | 8/1984 | Behr et al. |
| 4,469,923 A | 9/1984 | Charboneau |
| 4,470,092 A | 9/1984 | Lombardi |
| 4,470,266 A | 9/1984 | Briccetti et al. |
| 4,474,024 A | 10/1984 | Eplett et al. |
| 4,479,389 A | 10/1984 | Anderson, III et al. |
| 4,480,151 A | 10/1984 | Dozier |

(56) References Cited

U.S. PATENT DOCUMENTS

| | | |
|---|---|---|
| 4,489,551 A | 12/1984 | Watanabe et al. |
| 4,495,779 A | 1/1985 | Tanaka et al. |
| 4,496,296 A | 1/1985 | Arai et al. |
| 4,497,031 A | 1/1985 | Froehling et al. |
| 4,498,310 A | 2/1985 | Imanishi et al. |
| 4,499,739 A | 2/1985 | Matsuoka et al. |
| 4,502,084 A | 2/1985 | Hannett |
| 4,502,833 A | 3/1985 | Hibino et al. |
| 4,502,842 A | 3/1985 | Currier et al. |
| 4,502,843 A | 3/1985 | Martin |
| 4,506,518 A | 3/1985 | Yoshikawa et al. |
| 4,507,934 A | 4/1985 | Tanaka et al. |
| 4,508,413 A | 4/1985 | Bailey |
| 4,510,547 A | 4/1985 | Rudich, Jr. |
| 4,510,576 A | 4/1985 | MacArthur et al. |
| 4,512,161 A | 4/1985 | Logan et al. |
| 4,516,407 A | 5/1985 | Watabe |
| 4,520,674 A | 6/1985 | Canada et al. |
| 4,523,435 A | 6/1985 | Lord |
| 4,523,436 A | 6/1985 | Schedel et al. |
| 4,523,798 A | 6/1985 | Barrows et al. |
| 4,527,399 A | 7/1985 | Lord |
| 4,535,607 A | 8/1985 | Mount |
| 4,538,420 A | 9/1985 | Nelson |
| 4,538,422 A | 9/1985 | Mount et al. |
| 4,539,820 A | 9/1985 | Zinsmeyer |
| 4,545,210 A | 10/1985 | Lord |
| 4,545,214 A | 10/1985 | Kinoshita |
| 4,548,549 A | 10/1985 | Murphy et al. |
| 4,549,403 A | 10/1985 | Lord et al. |
| 4,549,404 A | 10/1985 | Lord |
| 4,550,770 A | 11/1985 | Nussdorfer et al. |
| 4,551,069 A | 11/1985 | Gilmore |
| 4,555,057 A | 11/1985 | Foster |
| 4,557,317 A | 12/1985 | Harmon, Jr. |
| 4,561,260 A | 12/1985 | Nishi et al. |
| 4,563,624 A | 1/1986 | Yu |
| 4,563,877 A | 1/1986 | Harnish |
| 4,573,880 A | 3/1986 | Hirano et al. |
| 4,574,871 A | 3/1986 | Parkinson et al. |
| 4,580,947 A | 4/1986 | Shibata et al. |
| 4,583,373 A | 4/1986 | Shaw |
| 4,589,060 A | 5/1986 | Zinsmeyer |
| 4,597,581 A | 7/1986 | Nimberger |
| 4,598,764 A | 7/1986 | Beckey |
| 4,602,484 A | 7/1986 | Bendikson |
| 4,611,470 A | 9/1986 | Enstrom |
| 4,612,775 A | 9/1986 | Branz et al. |
| 4,614,089 A | 9/1986 | Dorsey |
| 4,617,804 A | 10/1986 | Fukushima et al. |
| 4,620,424 A | 11/1986 | Tanaka et al. |
| 4,621,502 A | 11/1986 | Ibrahim et al. |
| 4,627,245 A | 12/1986 | Levine |
| 4,627,483 A | 12/1986 | Harshbarger, III et al. |
| 4,627,484 A | 12/1986 | Harshbarger, Jr. et al. |
| 4,630,670 A | 12/1986 | Wellman et al. |
| 4,642,034 A | 2/1987 | Terauchi |
| 4,646,532 A | 3/1987 | Nose |
| 4,649,710 A | 3/1987 | Inoue et al. |
| 4,653,280 A | 3/1987 | Hansen et al. |
| 4,653,285 A | 3/1987 | Pohl |
| 4,655,688 A | 4/1987 | Bohn et al. |
| 4,660,386 A | 4/1987 | Hansen et al. |
| 4,662,184 A | 5/1987 | Pohl et al. |
| 4,674,292 A | 6/1987 | Ohya et al. |
| 4,677,830 A | 7/1987 | Sumikawa et al. |
| 4,680,940 A | 7/1987 | Vaughn |
| 4,682,473 A | 7/1987 | Rogers, III |
| 4,684,060 A | 8/1987 | Adams et al. |
| 4,686,835 A | 8/1987 | Alsenz |
| 4,689,967 A | 9/1987 | Han et al. |
| 4,697,431 A | 10/1987 | Alsenz |
| 4,698,978 A | 10/1987 | Jones |
| 4,698,981 A | 10/1987 | Kaneko et al. |
| 4,701,824 A | 10/1987 | Beggs et al. |
| 4,706,152 A | 11/1987 | DeFilippis et al. |
| 4,706,469 A | 11/1987 | Oguni et al. |
| 4,712,430 A | 12/1987 | Wareham |
| 4,712,648 A | 12/1987 | Mattes et al. |
| 4,713,717 A | 12/1987 | Pejouhy et al. |
| 4,715,190 A | 12/1987 | Han et al. |
| 4,720,980 A | 1/1988 | Howland |
| 4,722,018 A | 1/1988 | Pohl |
| 4,722,019 A | 1/1988 | Pohl |
| 4,724,678 A | 2/1988 | Pohl |
| 4,735,054 A | 4/1988 | Beckey |
| 4,735,060 A | 4/1988 | Alsenz |
| 4,743,184 A | 5/1988 | Sumikawa et al. |
| 4,744,223 A | 5/1988 | Umezu |
| 4,745,765 A | 5/1988 | Pettitt |
| 4,745,766 A | 5/1988 | Bahr |
| 4,745,767 A | 5/1988 | Ohya et al. |
| 4,750,332 A | 6/1988 | Jenski et al. |
| 4,750,672 A | 6/1988 | Beckey et al. |
| 4,751,825 A | 6/1988 | Voorhis et al. |
| 4,755,957 A | 7/1988 | White et al. |
| 4,765,150 A | 8/1988 | Persem |
| 4,768,348 A | 9/1988 | Noguchi |
| 4,782,197 A | 11/1988 | Stunzi et al. |
| 4,790,142 A | 12/1988 | Beckey |
| 4,798,055 A | 1/1989 | Murray et al. |
| 4,805,118 A | 2/1989 | Rishel |
| 4,807,445 A | 2/1989 | Matsuoka et al. |
| 4,820,130 A | 4/1989 | Eber et al. |
| 4,829,779 A | 5/1989 | Munson et al. |
| 4,831,560 A | 5/1989 | Zaleski |
| 4,835,980 A | 6/1989 | Oyanagi et al. |
| 4,840,547 A | 6/1989 | Fry |
| 4,841,734 A | 6/1989 | Torrence |
| 4,845,956 A | 7/1989 | Berntsen et al. |
| 4,848,099 A | 7/1989 | Beckey et al. |
| 4,848,100 A | 7/1989 | Barthel et al. |
| 4,850,198 A | 7/1989 | Helt et al. |
| 4,850,204 A | 7/1989 | Bos et al. |
| 4,852,363 A | 8/1989 | Kampf et al. |
| 4,856,286 A | 8/1989 | Sulfstede et al. |
| 4,858,676 A | 8/1989 | Bolfik et al. |
| 4,866,944 A | 9/1989 | Yamazaki |
| 4,869,073 A | 9/1989 | Kawai et al. |
| 4,873,836 A | 10/1989 | Thompson |
| 4,877,382 A | 10/1989 | Caillat et al. |
| 4,878,355 A | 11/1989 | Beckey et al. |
| 4,881,184 A | 11/1989 | Abegg, III et al. |
| 4,882,908 A | 11/1989 | White |
| 4,884,412 A | 12/1989 | Sellers et al. |
| 4,885,707 A | 12/1989 | Nichol et al. |
| 4,885,914 A | 12/1989 | Pearman |
| 4,887,436 A | 12/1989 | Enomoto et al. |
| 4,887,857 A | 12/1989 | VanOmmeren |
| 4,889,280 A | 12/1989 | Grald et al. |
| 4,893,480 A | 1/1990 | Matsui et al. |
| 4,899,551 A | 2/1990 | Weintraub |
| 4,903,500 A | 2/1990 | Hanson |
| 4,909,041 A | 3/1990 | Jones |
| 4,909,076 A | 3/1990 | Busch et al. |
| 4,910,966 A | 3/1990 | Levine et al. |
| 4,913,625 A | 4/1990 | Gerlowski |
| 4,916,912 A | 4/1990 | Levine et al. |
| 4,918,932 A | 4/1990 | Gustafson et al. |
| 4,925,404 A | 5/1990 | Dutcher |
| 4,932,588 A | 6/1990 | Fedter et al. |
| 4,939,909 A | 7/1990 | Tsuchiyama et al. |
| 4,943,003 A | 7/1990 | Shimizu et al. |
| 4,944,160 A | 7/1990 | Malone et al. |
| 4,945,491 A | 7/1990 | Rishel |
| 4,953,784 A | 9/1990 | Yasufuku et al. |
| 4,959,970 A | 10/1990 | Meckler |
| 4,964,060 A | 10/1990 | Hartsog |
| 4,964,788 A | 10/1990 | Itameri-Kinter et al. |
| 4,966,006 A | 10/1990 | Thuesen et al. |
| 4,966,559 A | 10/1990 | Wisner |
| 4,967,567 A | 11/1990 | Proctor et al. |
| 4,970,496 A | 11/1990 | Kirkpatrick |
| 4,974,665 A | 12/1990 | Zillner, Jr. |

(56) References Cited

U.S. PATENT DOCUMENTS

| | | |
|---|---|---|
| 4,975,024 A | 12/1990 | Heckel |
| 4,977,751 A | 12/1990 | Hanson |
| 4,984,468 A | 1/1991 | Hafner |
| 4,984,973 A | 1/1991 | Itameri-Kinter et al. |
| 4,985,857 A | 1/1991 | Bajpai et al. |
| 4,987,748 A | 1/1991 | Meckler |
| 4,990,057 A | 2/1991 | Rollins |
| 4,991,770 A | 2/1991 | Bird et al. |
| 5,000,009 A | 3/1991 | Clanin |
| 5,009,075 A | 4/1991 | Okoren |
| 5,009,076 A | 4/1991 | Winslow |
| 5,012,629 A | 5/1991 | Rehman et al. |
| 5,018,665 A | 5/1991 | Sulmone |
| RE33,620 E | 6/1991 | Persem |
| 5,035,653 A | 7/1991 | Honkomp et al. |
| 5,042,264 A | 8/1991 | Dudley |
| 5,056,032 A | 10/1991 | Swanson et al. |
| 5,056,036 A | 10/1991 | Van Bork |
| 5,056,329 A | 10/1991 | Wilkinson |
| 5,058,388 A | 10/1991 | Shaw et al. |
| 5,062,278 A | 11/1991 | Sugiyama |
| 5,065,593 A | 11/1991 | Dudley et al. |
| RE33,775 E | 12/1991 | Behr et al. |
| 5,071,065 A | 12/1991 | Aalto et al. |
| 5,073,091 A | 12/1991 | Burgess et al. |
| 5,073,862 A | 12/1991 | Carlson |
| 5,076,067 A | 12/1991 | Prenger et al. |
| 5,076,494 A | 12/1991 | Ripka |
| 5,077,983 A | 1/1992 | Dudley |
| 5,094,086 A | 3/1992 | Shyu |
| 5,095,712 A | 3/1992 | Narreau |
| 5,095,715 A | 3/1992 | Dudley |
| 5,102,316 A | 4/1992 | Caillat et al. |
| 5,103,391 A | 4/1992 | Barrett |
| 5,109,676 A | 5/1992 | Waters et al. |
| 5,109,700 A | 5/1992 | Hicho |
| 5,115,406 A | 5/1992 | Zatezalo et al. |
| 5,115,643 A | 5/1992 | Hayata et al. |
| 5,115,644 A | 5/1992 | Alsenz |
| 5,118,260 A | 6/1992 | Fraser, Jr. |
| 5,119,466 A | 6/1992 | Suzuki |
| 5,119,637 A | 6/1992 | Bard et al. |
| 5,121,094 A | 6/1992 | Ting et al. |
| 5,121,610 A | 6/1992 | Atkinson et al. |
| 5,123,252 A | 6/1992 | Hanson |
| 5,123,253 A | 6/1992 | Hanson et al. |
| 5,123,255 A | 6/1992 | Ohizumi |
| RE34,001 E | 7/1992 | Wrobel |
| 5,134,888 A | 8/1992 | Zylka et al. |
| 5,141,407 A | 8/1992 | Ramsey et al. |
| 5,142,877 A | 9/1992 | Shimizu |
| 5,152,672 A | 10/1992 | Miyazawa et al. |
| 5,167,494 A | 12/1992 | Inagaki et al. |
| 5,170,935 A | 12/1992 | Federspiel et al. |
| 5,170,936 A | 12/1992 | Kubo et al. |
| 5,186,014 A | 2/1993 | Runk |
| 5,199,855 A | 4/1993 | Nakajima et al. |
| 5,199,898 A * | 4/1993 | Wisner ............... H01R 13/5202 439/367 |
| 5,200,872 A | 4/1993 | D'Entremont et al. |
| 5,201,673 A | 4/1993 | Minezawa et al. |
| 5,201,862 A | 4/1993 | Pettitt |
| 5,203,178 A | 4/1993 | Shyu |
| 5,209,076 A | 5/1993 | Kauffman et al. |
| 5,209,400 A | 5/1993 | Winslow et al. |
| 5,219,041 A | 6/1993 | Greve |
| 5,224,354 A | 7/1993 | Ito et al. |
| 5,224,835 A | 7/1993 | Oltman |
| 5,228,300 A | 7/1993 | Shim |
| 5,228,307 A | 7/1993 | Koce |
| 5,231,844 A | 8/1993 | Park |
| 5,233,841 A | 8/1993 | Jyrek |
| 5,235,526 A | 8/1993 | Saffell |
| 5,237,830 A | 8/1993 | Grant |
| 5,241,833 A | 9/1993 | Ohkoshi |
| 5,243,829 A | 9/1993 | Bessler |
| 5,248,244 A | 9/1993 | Ho et al. |
| 5,251,454 A | 10/1993 | Yoon |
| 5,252,036 A | 10/1993 | Bunch et al. |
| 5,257,506 A | 11/1993 | DeWolf et al. |
| 5,262,704 A | 11/1993 | Farr |
| 5,271,556 A | 12/1993 | Helt et al. |
| 5,276,630 A | 1/1994 | Baldwin et al. |
| 5,279,458 A | 1/1994 | DeWolf et al. |
| 5,290,154 A | 3/1994 | Kotlarek et al. |
| 5,291,752 A | 3/1994 | Alvarez et al. |
| 5,299,504 A | 4/1994 | Abele |
| 5,303,560 A | 4/1994 | Hanson et al. |
| 5,311,451 A | 5/1994 | Barrett |
| 5,315,878 A | 5/1994 | Birenheide |
| 5,320,506 A | 6/1994 | Fogt |
| 5,333,460 A | 8/1994 | Lewis et al. |
| 5,335,507 A | 8/1994 | Powell |
| 5,336,058 A | 8/1994 | Yokoyama |
| 5,362,206 A | 11/1994 | Westerman et al. |
| 5,362,211 A | 11/1994 | Iizuka et al. |
| 5,368,446 A | 11/1994 | Rode |
| 5,381,669 A | 1/1995 | Bahel et al. |
| 5,381,692 A | 1/1995 | Winslow et al. |
| 5,387,395 A | 2/1995 | Coassin et al. |
| 5,416,781 A | 5/1995 | Ruiz |
| 5,423,190 A | 6/1995 | Friedland |
| 5,423,192 A | 6/1995 | Young et al. |
| 5,435,148 A | 7/1995 | Sandofsky et al. |
| 5,440,890 A | 8/1995 | Bahel et al. |
| 5,440,895 A | 8/1995 | Bahel et al. |
| 5,446,677 A | 8/1995 | Jensen et al. |
| 5,454,229 A | 10/1995 | Hanson et al. |
| 5,460,006 A | 10/1995 | Torimitsu |
| 5,471,015 A | 11/1995 | Paterek et al. |
| 5,475,986 A | 12/1995 | Bahel et al. |
| 5,481,481 A | 1/1996 | Frey et al. |
| 5,483,141 A | 1/1996 | Uesugi |
| 5,493,073 A | 2/1996 | Honkomp |
| 5,499,512 A | 3/1996 | Jurewicz et al. |
| 5,503,542 A | 4/1996 | Grassbaugh et al. |
| 5,509,786 A | 4/1996 | Mizutani et al. |
| 5,511,387 A | 4/1996 | Tinsler |
| 5,513,603 A | 5/1996 | Ang et al. |
| 5,522,267 A | 6/1996 | Lewis |
| 5,528,908 A | 6/1996 | Bahel et al. |
| 5,532,534 A | 7/1996 | Baker et al. |
| 5,533,347 A | 7/1996 | Ott et al. |
| 5,535,597 A | 7/1996 | An |
| 5,546,015 A | 8/1996 | Okabe |
| 5,548,966 A | 8/1996 | Tinsler |
| 5,562,426 A | 10/1996 | Watanabe et al. |
| 5,579,648 A | 12/1996 | Hanson et al. |
| 5,580,282 A | 12/1996 | Paterek |
| 5,584,716 A | 12/1996 | Bergman |
| 5,586,445 A | 12/1996 | Bessler |
| 5,592,824 A | 1/1997 | Sogabe et al. |
| 5,596,507 A | 1/1997 | Jones et al. |
| 5,602,757 A | 2/1997 | Haseley et al. |
| 5,610,339 A | 3/1997 | Haseley et al. |
| 5,611,674 A | 3/1997 | Bass et al. |
| 5,613,841 A | 3/1997 | Bass et al. |
| 5,615,071 A | 3/1997 | Higashikata et al. |
| 5,616,829 A | 4/1997 | Balaschak et al. |
| 5,623,834 A | 4/1997 | Bahel et al. |
| 5,628,201 A | 5/1997 | Bahel et al. |
| 5,630,325 A | 5/1997 | Bahel et al. |
| 5,641,270 A | 6/1997 | Sgourakes et al. |
| 5,655,379 A | 8/1997 | Jaster et al. |
| 5,656,767 A | 8/1997 | Garvey, III et al. |
| 5,669,763 A | 9/1997 | Pryce et al. |
| 5,689,963 A | 11/1997 | Bahel et al. |
| 5,691,692 A | 11/1997 | Herbstritt |
| 5,699,670 A | 12/1997 | Jurewicz et al. |
| 5,707,210 A | 1/1998 | Ramsey et al. |
| 5,712,428 A | 1/1998 | Schleiferbock et al. |
| 5,713,724 A | 2/1998 | Centers et al. |
| 5,737,931 A | 4/1998 | Ueno et al. |
| 5,741,120 A | 4/1998 | Bass et al. |

(56) References Cited

U.S. PATENT DOCUMENTS

| | | | |
|---|---|---|---|
| 5,746,622 A | 5/1998 | Consoli et al. | |
| 5,749,238 A | 5/1998 | Schmidt | |
| 5,750,899 A | 5/1998 | Hegner et al. | |
| 5,754,450 A | 5/1998 | Solomon et al. | |
| 5,756,899 A | 5/1998 | Ugai et al. | |
| 5,769,659 A * | 6/1998 | Ceylan | H01R 13/5213 |
| | | | 439/521 |
| 5,772,403 A | 6/1998 | Allison et al. | |
| 5,795,381 A | 8/1998 | Holder | |
| 5,798,941 A | 8/1998 | McLeister | |
| 5,802,860 A | 9/1998 | Barrows | |
| 5,807,336 A | 9/1998 | Russo et al. | |
| 5,808,441 A | 9/1998 | Nehring | |
| 5,831,170 A | 11/1998 | Sokn | |
| 5,857,348 A | 1/1999 | Conry | |
| 5,869,960 A | 2/1999 | Brand | |
| 5,872,315 A | 2/1999 | Nagase et al. | |
| 5,875,638 A | 3/1999 | Tinsler | |
| 5,884,494 A | 3/1999 | Okoren et al. | |
| 5,886,726 A | 3/1999 | Pawelka et al. | |
| 5,894,596 A | 4/1999 | Hayes, Jr. | |
| 5,924,295 A | 7/1999 | Park | |
| 5,930,553 A | 7/1999 | Hirst et al. | |
| 5,941,730 A | 8/1999 | Uchiyama et al. | |
| 5,947,701 A | 9/1999 | Hugenroth | |
| 5,950,443 A | 9/1999 | Meyer et al. | |
| 5,956,658 A | 9/1999 | McMahon | |
| 5,971,712 A | 10/1999 | Kann | |
| 5,975,854 A * | 11/1999 | Culp, III | F04C 23/008 |
| | | | 417/18 |
| 5,984,645 A | 11/1999 | Cummings | |
| 5,987,903 A | 11/1999 | Bathla | |
| 5,988,986 A | 11/1999 | Brinken et al. | |
| 5,995,347 A | 11/1999 | Rudd et al. | |
| 5,995,351 A | 11/1999 | Katsumata et al. | |
| 6,011,368 A | 1/2000 | Kalpathi et al. | |
| 6,017,192 A | 1/2000 | Clack et al. | |
| 6,020,702 A | 2/2000 | Farr | |
| 6,023,420 A | 2/2000 | McCormick et al. | |
| 6,035,653 A | 3/2000 | Itoh et al. | |
| 6,035,661 A | 3/2000 | Sunaga et al. | |
| 6,037,423 A | 3/2000 | Nagano et al. | |
| 6,041,605 A | 3/2000 | Heinrichs | |
| 6,041,609 A | 3/2000 | Hornsleth et al. | |
| 6,042,344 A | 3/2000 | Lifson | |
| 6,047,557 A | 4/2000 | Pham et al. | |
| 6,050,780 A | 4/2000 | Hasegawa et al. | |
| 6,057,771 A | 5/2000 | Lakra | |
| 6,065,946 A | 5/2000 | Lathrop | |
| 6,068,447 A | 5/2000 | Foege | |
| 6,077,051 A | 6/2000 | Centers et al. | |
| 6,081,750 A | 6/2000 | Hoffberg et al. | |
| 6,082,495 A | 7/2000 | Steinbarger et al. | |
| 6,082,971 A | 7/2000 | Gunn et al. | |
| 6,085,530 A | 7/2000 | Barito | |
| 6,086,335 A | 7/2000 | Bass et al. | |
| 6,092,370 A | 7/2000 | Tremoulet, Jr. et al. | |
| 6,092,378 A | 7/2000 | Das et al. | |
| 6,092,992 A | 7/2000 | Imblum et al. | |
| 6,102,665 A | 8/2000 | Centers et al. | |
| 6,102,666 A | 8/2000 | Albrecht | |
| 6,125,312 A | 9/2000 | Nguyen et al. | |
| 6,125,642 A | 10/2000 | Seener et al. | |
| 6,128,583 A | 10/2000 | Dowling | |
| 6,129,527 A | 10/2000 | Donahoe et al. | |
| 6,140,592 A | 10/2000 | Paterek et al. | |
| 6,153,993 A | 11/2000 | Oomura et al. | |
| 6,157,310 A | 12/2000 | Milne et al. | |
| 6,158,230 A | 12/2000 | Katsuki | |
| 6,174,136 B1 | 1/2001 | Kilayko et al. | |
| 6,176,686 B1 | 1/2001 | Wallis et al. | |
| 6,179,214 B1 | 1/2001 | Key et al. | |
| 6,181,033 B1 | 1/2001 | Wright | |
| 6,199,018 B1 | 3/2001 | Quist et al. | |
| 6,224,348 B1 | 5/2001 | Fukanuma et al. | |
| 6,244,824 B1 | 6/2001 | Centers et al. | |
| 6,260,004 B1 | 7/2001 | Hays et al. | |
| 6,276,901 B1 | 8/2001 | Farr et al. | |
| 6,279,332 B1 | 8/2001 | Yeo et al. | |
| 6,290,528 B1 | 9/2001 | Moore, Jr. et al. | |
| 6,302,654 B1 * | 10/2001 | Millet | F04C 18/0215 |
| | | | 417/228 |
| 6,324,854 B1 | 12/2001 | Jayanth | |
| 6,332,327 B1 | 12/2001 | Street et al. | |
| 6,350,630 B1 | 2/2002 | Wildgen | |
| 6,351,996 B1 | 3/2002 | Nasiri et al. | |
| 6,360,551 B1 | 3/2002 | Renders | |
| 6,361,281 B1 | 3/2002 | Wurth et al. | |
| 6,366,199 B1 | 4/2002 | Osborn et al. | |
| 6,372,993 B1 | 4/2002 | Eckels et al. | |
| 6,375,439 B1 * | 4/2002 | Missio | F25B 31/00 |
| | | | 417/410.1 |
| 6,375,497 B1 | 4/2002 | DiFlora | |
| 6,381,971 B2 | 5/2002 | Honda | |
| 6,390,779 B1 | 5/2002 | Cunkelman | |
| 6,406,265 B1 | 6/2002 | Hahn et al. | |
| 6,406,266 B1 | 6/2002 | Hugenroth et al. | |
| 6,412,293 B1 | 7/2002 | Pham et al. | |
| 6,422,830 B1 | 7/2002 | Yamada et al. | |
| 6,435,017 B1 | 8/2002 | Nowicki, Jr. et al. | |
| 6,438,981 B1 | 8/2002 | Whiteside | |
| 6,442,953 B1 | 9/2002 | Trigiani et al. | |
| 6,449,972 B2 | 9/2002 | Pham et al. | |
| 6,450,771 B1 | 9/2002 | Centers et al. | |
| 6,453,687 B2 | 9/2002 | Sharood et al. | |
| 6,454,538 B1 | 9/2002 | Witham et al. | |
| 6,457,319 B1 | 10/2002 | Ota et al. | |
| 6,457,948 B1 | 10/2002 | Pham | |
| 6,467,280 B2 | 10/2002 | Pham et al. | |
| 6,471,486 B1 | 10/2002 | Centers et al. | |
| 6,484,520 B2 | 11/2002 | Kawaguchi et al. | |
| 6,484,585 B1 | 11/2002 | Sittler et al. | |
| 6,487,457 B1 | 11/2002 | Hull et al. | |
| 6,492,923 B1 | 12/2002 | Inoue et al. | |
| 6,497,554 B2 | 12/2002 | Yang et al. | |
| 6,501,240 B2 | 12/2002 | Ueda et al. | |
| 6,501,629 B1 | 12/2002 | Marriott | |
| 6,502,409 B1 | 1/2003 | Gatling et al. | |
| 6,505,475 B1 | 1/2003 | Zugibe et al. | |
| 6,529,590 B1 | 3/2003 | Centers | |
| 6,533,552 B2 | 3/2003 | Centers et al. | |
| 6,537,034 B2 | 3/2003 | Park et al. | |
| 6,542,062 B1 | 4/2003 | Herrick | |
| 6,553,663 B2 | 4/2003 | Bunch et al. | |
| 6,558,126 B1 | 5/2003 | Hahn et al. | |
| 6,560,976 B2 | 5/2003 | Jayanth | |
| 6,567,709 B1 | 5/2003 | Malm et al. | |
| 6,570,097 B2 | 5/2003 | Monde et al. | |
| 6,571,566 B1 | 6/2003 | Temple et al. | |
| 6,571,586 B1 | 6/2003 | Ritson et al. | |
| 6,589,029 B1 | 7/2003 | Heller | |
| 6,595,757 B2 | 7/2003 | Shen | |
| 6,601,397 B2 | 8/2003 | Pham et al. | |
| 6,607,367 B2 | 8/2003 | Shibamoto et al. | |
| 6,615,594 B2 | 9/2003 | Jayanth et al. | |
| 6,616,415 B1 | 9/2003 | Renken et al. | |
| 6,625,997 B1 | 9/2003 | Schultz | |
| 6,629,420 B2 | 10/2003 | Renders | |
| 6,647,735 B2 | 11/2003 | Street et al. | |
| 6,649,836 B2 * | 11/2003 | Brechbill | F04B 39/12 |
| | | | 174/60 |
| 6,658,373 B2 | 12/2003 | Rossi et al. | |
| 6,672,846 B2 | 1/2004 | Rajendran et al. | |
| 6,675,591 B2 | 1/2004 | Singh et al. | |
| 6,679,072 B2 | 1/2004 | Pham et al. | |
| 6,685,438 B2 | 2/2004 | Yoo et al. | |
| 6,694,204 B1 | 2/2004 | Bair, III et al. | |
| 6,704,202 B1 * | 3/2004 | Hamaoka | F25D 23/006 |
| | | | 361/690 |
| 6,709,244 B2 | 3/2004 | Pham | |
| 6,709,299 B2 | 3/2004 | Listing et al. | |
| 6,711,911 B1 | 3/2004 | Grabon et al. | |
| 6,716,009 B2 | 4/2004 | Sowa et al. | |

(56) References Cited

U.S. PATENT DOCUMENTS

| | | | |
|---|---|---|---|
| 6,752,646 B2 * | 6/2004 | McCoy | H01R 13/447 439/367 |
| 6,755,631 B2 * | 6/2004 | Kawashima | F04B 39/12 417/313 |
| 6,758,050 B2 | 7/2004 | Jayanth et al. | |
| 6,758,051 B2 | 7/2004 | Jayanth et al. | |
| 6,760,207 B2 | 7/2004 | Wyatt et al. | |
| 6,760,216 B2 | 7/2004 | Seo | |
| 6,779,989 B2 | 8/2004 | Makino et al. | |
| 6,799,951 B2 | 10/2004 | Lifson et al. | |
| 6,811,380 B2 | 11/2004 | Kim | |
| 6,823,680 B2 | 11/2004 | Jayanth | |
| 6,829,542 B1 | 12/2004 | Reynolds et al. | |
| 6,832,120 B1 | 12/2004 | Frank et al. | |
| 6,832,898 B2 | 12/2004 | Yoshida et al. | |
| 6,848,916 B2 | 2/2005 | Nakayama et al. | |
| 6,866,487 B2 | 3/2005 | Abe et al. | |
| 6,869,272 B2 | 3/2005 | Odachi et al. | |
| 6,883,379 B2 | 4/2005 | Kaneko et al. | |
| 6,910,904 B2 | 6/2005 | Herrick et al. | |
| 6,916,210 B2 | 7/2005 | Moore, Jr. et al. | |
| 6,923,068 B2 | 8/2005 | Barron | |
| 6,925,885 B2 | 8/2005 | Ishio et al. | |
| 6,934,862 B2 | 8/2005 | Sharood et al. | |
| 6,964,558 B2 | 11/2005 | Hahn et al. | |
| 6,966,759 B2 | 11/2005 | Hahn et al. | |
| 6,973,794 B2 | 12/2005 | Street et al. | |
| 6,981,384 B2 | 1/2006 | Dobmeier et al. | |
| 6,986,469 B2 | 1/2006 | Gauthier et al. | |
| 6,999,996 B2 | 2/2006 | Sunderland | |
| 7,000,422 B2 | 2/2006 | Street et al. | |
| 7,024,261 B1 | 4/2006 | Tanton | |
| 7,042,180 B2 | 5/2006 | Terry et al. | |
| 7,047,753 B2 | 5/2006 | Street et al. | |
| 7,056,104 B2 | 6/2006 | Kimura et al. | |
| 7,077,694 B2 | 7/2006 | Nakano et al. | |
| 7,079,967 B2 | 7/2006 | Rossi et al. | |
| 7,108,489 B2 | 9/2006 | Yap | |
| 7,113,376 B2 | 9/2006 | Nomura et al. | |
| 7,123,458 B2 | 10/2006 | Mohr et al. | |
| 7,124,728 B2 | 10/2006 | Carey et al. | |
| 7,130,170 B2 | 10/2006 | Wakefield et al. | |
| 7,134,295 B2 | 11/2006 | Maekawa | |
| 7,141,738 B2 | 11/2006 | Marsac et al. | |
| 7,163,411 B2 * | 1/2007 | Kawashima | F04B 39/12 439/135 |
| 7,174,728 B2 | 2/2007 | Jayanth | |
| 7,194,871 B2 | 3/2007 | De Bernardi et al. | |
| 7,225,959 B2 | 6/2007 | Patton et al. | |
| 7,228,691 B2 | 6/2007 | Street et al. | |
| 7,252,005 B2 | 8/2007 | Schulman | |
| 7,270,278 B2 | 9/2007 | Street et al. | |
| 7,278,834 B2 * | 10/2007 | Herrick | F04B 39/0044 248/638 |
| 7,290,989 B2 * | 11/2007 | Jayanth | F04C 23/008 417/44.1 |
| 7,352,545 B2 | 4/2008 | Wyatt et al. | |
| 7,387,519 B2 * | 6/2008 | Sugiyama | H01R 13/447 174/138 F |
| 7,412,842 B2 | 8/2008 | Pham | |
| 7,419,742 B2 * | 9/2008 | Liu | H02J 7/0045 429/100 |
| 7,421,850 B2 | 9/2008 | Street et al. | |
| 7,447,603 B2 | 11/2008 | Bruno | |
| 7,458,223 B2 | 12/2008 | Pham | |
| 7,459,631 B2 | 12/2008 | Nakayama et al. | |
| 7,484,376 B2 | 2/2009 | Pham | |
| 7,491,034 B2 | 2/2009 | Jayanth | |
| 7,559,794 B2 | 7/2009 | Taguchi et al. | |
| 7,647,201 B2 * | 1/2010 | Jayanth | F04B 49/10 340/3.31 |
| 7,752,014 B2 | 7/2010 | Jayanth et al. | |
| 7,866,964 B2 | 1/2011 | Jayanth | |
| 7,878,006 B2 | 2/2011 | Pham | |
| 7,905,098 B2 | 3/2011 | Pham | |
| 7,935,888 B2 | 5/2011 | Hansen et al. | |
| 7,997,877 B2 | 8/2011 | Beagle et al. | |
| 8,036,853 B2 | 10/2011 | Jayanth et al. | |
| 8,089,032 B2 | 1/2012 | Beland et al. | |
| 8,160,827 B2 | 4/2012 | Jayanth et al. | |
| 8,228,648 B2 | 7/2012 | Jayanth et al. | |
| 8,235,687 B2 | 8/2012 | Hasegawa | |
| 8,279,565 B2 | 10/2012 | Hall et al. | |
| 8,335,657 B2 | 12/2012 | Jayanth et al. | |
| 8,393,169 B2 | 3/2013 | Pham | |
| 8,474,278 B2 | 7/2013 | Pham | |
| 8,721,371 B2 | 5/2014 | Picker et al. | |
| 8,801,400 B2 * | 8/2014 | Thibodeaux | F04B 35/04 337/35 |
| 8,876,496 B2 | 11/2014 | Rogalski | |
| 8,939,734 B2 * | 1/2015 | Hoying | F04B 39/121 417/410.1 |
| 8,939,735 B2 | 1/2015 | Heidecker et al. | |
| 9,502,873 B2 | 11/2016 | Bingham et al. | |
| 2001/0005320 A1 | 6/2001 | Ueda et al. | |
| 2001/0025349 A1 | 9/2001 | Sharood et al. | |
| 2001/0054293 A1 | 12/2001 | Gustafson et al. | |
| 2001/0054294 A1 | 12/2001 | Tsuboi | |
| 2002/0016655 A1 | 2/2002 | Joao | |
| 2002/0018724 A1 | 2/2002 | Millet et al. | |
| 2002/0020175 A1 | 2/2002 | Street et al. | |
| 2002/0040280 A1 | 4/2002 | Morgan | |
| 2002/0057025 A1 | 5/2002 | Mademba-Sy et al. | |
| 2002/0064463 A1 | 5/2002 | Park et al. | |
| 2002/0067999 A1 | 6/2002 | Suitou et al. | |
| 2002/0081899 A1 | 6/2002 | Korber | |
| 2002/0093259 A1 | 7/2002 | Sunaga et al. | |
| 2002/0117992 A1 | 8/2002 | Hirono et al. | |
| 2002/0127120 A1 * | 9/2002 | Hahn | F04C 23/008 417/280 |
| 2002/0130770 A1 | 9/2002 | Keyworth et al. | |
| 2002/0139128 A1 | 10/2002 | Suzuki et al. | |
| 2002/0155741 A1 | 10/2002 | Herrick et al. | |
| 2002/0159890 A1 | 10/2002 | Kajiwara et al. | |
| 2002/0163785 A1 | 11/2002 | Brechbill et al. | |
| 2002/0170299 A1 | 11/2002 | Jayanth et al. | |
| 2002/0182082 A1 | 12/2002 | Centers et al. | |
| 2002/0182935 A1 | 12/2002 | Monde et al. | |
| 2003/0012669 A1 * | 1/2003 | Kawashima | F04B 39/12 417/423.1 |
| 2003/0019221 A1 | 1/2003 | Rossi et al. | |
| 2003/0037555 A1 | 2/2003 | Street et al. | |
| 2003/0078742 A1 | 4/2003 | VanderZee et al. | |
| 2003/0094004 A1 | 5/2003 | Pham et al. | |
| 2003/0108430 A1 | 6/2003 | Yoshida et al. | |
| 2003/0115890 A1 | 6/2003 | Jayanth et al. | |
| 2003/0156954 A1 | 8/2003 | Kimura et al. | |
| 2003/0190835 A1 | 10/2003 | Hawkes et al. | |
| 2004/0016241 A1 | 1/2004 | Street et al. | |
| 2004/0016244 A1 | 1/2004 | Street et al. | |
| 2004/0016251 A1 | 1/2004 | Street et al. | |
| 2004/0016253 A1 | 1/2004 | Street et al. | |
| 2004/0020299 A1 | 2/2004 | Freakes et al. | |
| 2004/0024495 A1 | 2/2004 | Sunderland | |
| 2004/0037706 A1 | 2/2004 | Hahn et al. | |
| 2004/0042904 A1 | 3/2004 | Kim | |
| 2004/0049324 A1 | 3/2004 | Walker | |
| 2004/0093879 A1 | 5/2004 | Street et al. | |
| 2004/0118146 A1 | 6/2004 | Haller et al. | |
| 2004/0133367 A1 | 7/2004 | Hart | |
| 2004/0144106 A1 | 7/2004 | Douglas et al. | |
| 2004/0179966 A1 | 9/2004 | Kawashima et al. | |
| 2004/0184627 A1 | 9/2004 | Kost et al. | |
| 2004/0184928 A1 | 9/2004 | Millet et al. | |
| 2004/0184929 A1 | 9/2004 | Millet et al. | |
| 2004/0184930 A1 | 9/2004 | Millet et al. | |
| 2004/0184931 A1 | 9/2004 | Millet et al. | |
| 2004/0187502 A1 | 9/2004 | Jayanth et al. | |
| 2004/0191073 A1 | 9/2004 | Iimura et al. | |
| 2004/0215520 A1 | 10/2004 | Butler et al. | |
| 2004/0258542 A1 | 12/2004 | Wiertz et al. | |
| 2004/0261431 A1 | 12/2004 | Singh et al. | |
| 2005/0028585 A1 | 2/2005 | Matsumura et al. | |

(56) References Cited

U.S. PATENT DOCUMENTS

| | | |
|---|---|---|
| 2005/0028596 A1 | 2/2005 | Gall |
| 2005/0040249 A1 | 2/2005 | Wacker et al. |
| 2005/0053471 A1 | 3/2005 | Hong et al. |
| 2005/0100449 A1 | 5/2005 | Hahn et al. |
| 2005/0103036 A1 | 5/2005 | Maekawa |
| 2005/0124203 A1 | 6/2005 | Herrick et al. |
| 2005/0166610 A1 | 8/2005 | Jayanth |
| 2005/0172647 A1 | 8/2005 | Thybo et al. |
| 2005/0196285 A1 | 9/2005 | Jayanth |
| 2005/0207741 A1 | 9/2005 | Shah et al. |
| 2005/0214148 A1 | 9/2005 | Ogawa et al. |
| 2005/0217383 A1 | 10/2005 | Tohyama et al. |
| 2005/0232781 A1 | 10/2005 | Herbert et al. |
| 2005/0235660 A1 | 10/2005 | Pham |
| 2005/0235661 A1 | 10/2005 | Pham |
| 2005/0235662 A1 | 10/2005 | Pham |
| 2005/0235663 A1 | 10/2005 | Pham |
| 2005/0235664 A1 | 10/2005 | Pham |
| 2005/0252220 A1 | 11/2005 | Street et al. |
| 2005/0262856 A1 | 12/2005 | Street et al. |
| 2006/0013697 A1 | 1/2006 | Uratani |
| 2006/0023388 A1 | 2/2006 | Ichikawa et al. |
| 2006/0042276 A1 | 3/2006 | Doll et al. |
| 2006/0068626 A1 | 3/2006 | Hasegawa |
| 2006/0117773 A1 | 6/2006 | Street et al. |
| 2006/0129339 A1 | 6/2006 | Bruno |
| 2006/0141838 A1 | 6/2006 | Kertesz |
| 2006/0144153 A1 | 7/2006 | Brosh |
| 2006/0151037 A1 | 7/2006 | Lepola et al. |
| 2006/0185373 A1 | 8/2006 | Butler et al. |
| 2006/0211810 A1 | 9/2006 | Persigehl et al. |
| 2006/0222507 A1 | 10/2006 | Jayanth |
| 2006/0238388 A1 | 10/2006 | Jayanth |
| 2006/0244641 A1 | 11/2006 | Jayanth et al. |
| 2006/0256488 A1 | 11/2006 | Benzing et al. |
| 2006/0275143 A1 | 12/2006 | Jayanth |
| 2006/0280627 A1 | 12/2006 | Jayanth |
| 2007/0002505 A1 | 1/2007 | Watanabe et al. |
| 2007/0101750 A1 | 5/2007 | Pham et al. |
| 2007/0184697 A1 | 8/2007 | Taguchi et al. |
| 2008/0136122 A1 | 6/2008 | Gambier |
| 2008/0209925 A1 | 9/2008 | Pham |
| 2008/0216494 A1 | 9/2008 | Pham et al. |
| 2008/0253721 A1 | 10/2008 | Van Der Steen |
| 2008/0264921 A1 | 10/2008 | Kropp et al. |
| 2009/0060749 A1 | 3/2009 | Hoying et al. |
| 2009/0071175 A1 | 3/2009 | Pham |
| 2009/0119036 A1 | 5/2009 | Jayanth et al. |
| 2009/0234051 A1 | 9/2009 | Endtner et al. |
| 2009/0241570 A1 | 10/2009 | Kuribayashi et al. |
| 2009/0251033 A1 | 10/2009 | Helms et al. |
| 2010/0089076 A1 | 4/2010 | Schuster et al. |
| 2010/0196175 A1* | 8/2010 | Bedell .............. F04B 39/12 417/410.5 |
| 2010/0242548 A1 | 9/2010 | Webster et al. |
| 2011/0076162 A1* | 3/2011 | Heidecker .......... F04B 39/121 417/313 |
| 2012/0282124 A1 | 11/2012 | Bingham et al. |
| 2013/0182285 A1 | 7/2013 | Matsuhara et al. |
| 2014/0029178 A1* | 1/2014 | Trudeau, Jr. .......... H05K 7/02 361/679.01 |
| 2016/0230763 A1* | 8/2016 | Ignatiev .............. F04C 2/46 |

FOREIGN PATENT DOCUMENTS

| | | |
|---|---|---|
| CN | 1302395 A | 7/2001 |
| CN | 1356472A A | 7/2002 |
| CN | 1830131 A | 9/2006 |
| CN | 2821211 Y | 9/2006 |
| CN | 1892029 A | 1/2007 |
| CN | 1926738 A | 3/2007 |
| CN | 1991169 A | 7/2007 |
| CN | 101052847 A | 10/2007 |
| CN | 200959411 Y | 10/2007 |
| CN | 101790643 A | 7/2010 |
| CN | 102272455 A | 12/2011 |
| CN | 102362072 A | 2/2012 |
| CN | 203476681 U | 3/2014 |
| DE | 1403407 A1 | 10/1968 |
| DE | 1403467 A1 | 10/1969 |
| DE | 3118638 A1 | 5/1982 |
| DE | 29723145 U1 | 4/1998 |
| EP | 0008524 A1 | 3/1980 |
| EP | 0060172 A1 | 9/1982 |
| EP | 0085246 A1 | 8/1983 |
| EP | 0284633 A1 | 10/1988 |
| EP | 0351272 A1 | 1/1990 |
| EP | 0355255 A2 | 2/1990 |
| EP | 0361394 A2 | 4/1990 |
| EP | 0398436 A1 | 11/1990 |
| EP | 0432085 A2 | 6/1991 |
| EP | 0453302 A1 | 10/1991 |
| EP | 0 677 727 A2 | 10/1995 |
| EP | 0877462 A2 | 11/1998 |
| EP | 1020646 A1 | 7/2000 |
| EP | 1087184 A2 | 3/2001 |
| EP | 1138949 A2 | 10/2001 |
| EP | 1241417 A1 | 9/2002 |
| EP | 1245912 A2 | 10/2002 |
| EP | 1245913 A1 | 10/2002 |
| EP | 1500821 A2 | 1/2005 |
| EP | 1622228 A1 | 2/2006 |
| EP | 1845591 A2 | 10/2007 |
| EP | 1884728 A1 | 2/2008 |
| FR | 2472862 A1 | 7/1981 |
| GB | 2062919 A | 5/1981 |
| GB | 2075774 A | 11/1981 |
| GB | 2254452 A | 10/1992 |
| GB | 2325280 A | 11/1998 |
| JP | 63061783 A | 3/1988 |
| JP | 02104995 A | 4/1990 |
| JP | 02110242 A | 4/1990 |
| JP | 02294580 A | 12/1990 |
| JP | 06058273 A | 3/1994 |
| JP | 08021675 A | 1/1996 |
| JP | 09032775 | 2/1997 |
| JP | 2000350490 A | 12/2000 |
| JP | 2001116638 A | 4/2001 |
| JP | 2002155868 A | 5/2002 |
| JP | 2003176788 A | 6/2003 |
| JP | 2004316504 A | 11/2004 |
| JP | 2005188790 A | 7/2005 |
| JP | 2005-307798 A | 11/2005 |
| JP | 2005307798 A | 11/2005 |
| JP | 2006046219 A | 2/2006 |
| JP | 2006046519 A | 2/2006 |
| JP | 2006097557 A | 4/2006 |
| KR | 1020000000261 | 1/2000 |
| KR | 1020000025265 | 5/2000 |
| KR | 1020020041977 | 6/2002 |
| KR | 1020040021281 | 3/2004 |
| KR | 1020060020353 | 3/2006 |
| KR | 100612123 B1 | 8/2006 |
| WO | WO-8806703 A1 | 9/1988 |
| WO | WO-9718636 A2 | 5/1997 |
| WO | WO-9917066 A1 | 4/1999 |
| WO | WO-9961847 A1 | 12/1999 |
| WO | WO-9965681 A1 | 12/1999 |
| WO | WO-0051223 A1 | 8/2000 |
| WO | WO-0169147 A1 | 9/2001 |
| WO | WO-0249178 A2 | 6/2002 |
| WO | WO-0275227 A1 | 9/2002 |
| WO | WO-2005108882 A2 | 11/2005 |
| WO | WO-2006013872 A1 | 2/2006 |
| WO | WO-2006025880 A1 | 3/2006 |
| WO | WO-2006080695 A1 | 8/2006 |
| WO | WO-2007/074852 A1 | 7/2007 |
| WO | WO-2009058356 A1 | 5/2009 |
| WO | WO-2010111492 A2 | 9/2010 |

(56) References Cited

FOREIGN PATENT DOCUMENTS

WO  WO-20100111492 A2  9/2010
WO  WO-2012064932 A1  5/2012

OTHER PUBLICATIONS

"Manual for Freezing and Air Conditioning Technology," Fan Jili, Liaoning Science and Technology Press, Sep. 1995 (cited in First Office Action issued by the Chinese Patent Office regarding Application No. 200780030810.X dated Dec. 25, 2009).
"Product Performance Introduction of York Company," cited in First Office Action from the Patent Office of the People's Republic of China dated Jun. 29, 2007 regarding Application No. 200510005907.8, including translation by CCPIT Patent and Trademark Law Office.
"Small-type Freezing and Air Conditioning Operation," Chinese State Economy and Trading Committee, China Meteorological Press, Mar. 2003 (cited in First Office Action issued by the Chinese Patent Office regarding Application No. 200780030810.X dated Dec. 25, 2009).
"Vital Sign: Fertility; Help for Vasectomy Reversals that Fail," New York Times, Apr. 1999, 1 page.
Advisory Action Before the Filing of an Appeal Brief for U.S. Appl. No. 11/474,798, dated Jan. 27, 2009.
Advisory Action Before the Filing of an Appeal Brief for U.S. Appl. No. 11/474,865, dated Jul. 30, 2009.
Advisory Action Before the Filing of an Appeal Brief regarding U.S. Appl. No. 11/134,130 dated Oct. 24, 2008.
Advisory Action Before the Filing of an Appeal Brief regarding U.S. Appl. No. 11/098,575, dated Nov. 16, 2009.
Advisory Action Before the Filing of an Appeal Brief regarding U.S. Appl. No. 11/098,575, dated Sep. 28, 2009.
Advisory Action Before the Filing of an Appeal Brief regarding U.S. Appl. No. 09/977,552, dated Nov. 10, 2005.
BChydro, "Power Factor" Guides to Energy Management: The GEM Series, Oct. 1999.
Building Control Unit (BCU) Installation and Operation Manual, Computer Process Controls, Jan. 28, 1998, 141 pages.
Building Environmental Control (BEC) Installation and Operation Manual, Computer Process Controls, Jan. 5, 1998.
Chinese Office Action dated Nov. 28, 2008, and English translation of the Chinese Office Action entitled "Text Portion of the First Office Action" provided by CCPIT Patent and Trademark Law Office on Dec. 18, 2008.
Chinese Second Office Action dated Jan. 8, 2010 and issued in connection with a corresponding Chinese Application. Translation prepared by Unitalen Attorneys at Law.
Einstein RX-300 Refrigeration Controller Installation and Operation Manual, Computer Process Controls, Apr. 1, 1998, 329 pages.
Election/Restriction Requirement regarding U.S. Appl. No. 09/977,552, dated Jan. 25, 2007.
European Search Report for Application No. EP 01 30 1752, dated Mar. 26, 2002.
European Search Report for Application No. EP 02 25 1531, dated Sep. 30, 2002.
European Search Report for Application No. EP 04 81 5853, dated Jul. 17, 2007, 2 Pages.
European Search Report for Application No. EP 06 02 6263, dated Jul. 17, 2007, 4 Pages.
European Search Report for Application No. EP 12 182 243.1, dated Oct. 29, 2012.
European Search Report regarding Application No. 04022784.5-2315 / 1500821, dated Aug. 14, 2012.
European Search Report regarding Application No. 07020595.0-1610 / 1879111, dated Apr. 3, 2014.
European Search Report regarding European Patent Application No. EP06252199, dated Feb. 6, 2007.
Examiner's Answer regarding U.S. Appl. No. 09/977,552, dated Dec. 17, 2009.
Examiner's First Report on Australian Patent Application No. 2006201675, dated Sep. 29, 2010.
Examiner's First Report on Australian Patent Application No. 2007292917 dated Jan. 10, 2012.
Examiner's First Report on Australian Patent Application No. 2008319275, dated Jan. 31, 2011.
Examiner's Report No. 2 on Australian Patent Application No. 2006201675, dated Jul. 29, 2011.
Examiner's Report No. 2 regarding Australian Patent Application No. 2008325240, dated Mar. 5, 2012.
Extended European Search Report regarding Application No. 07020596.8-1610 / 1879112, dated Jul. 22, 2014.
Extended European Search Report regarding Application No. 12182243.1-2311, dated Oct. 29, 2012.
Extended European Search Report regarding European Application No. 08845689.2-1608/2207964, dated Jun. 19, 2015.
Extended Search Report regarding European Patent Application No. 07020595.0-1610 / 1879111, dated Apr. 3, 2014.
Final Office Action for U.S. Appl. No. 11/134,130, dated Mar. 9, 2010.
Final Office Action for U.S. Appl. No. 11/134,130, dated May 14, 2009.
Final Office Action for U.S. Appl. No. 11/850,846, dated Aug. 13, 2012.
Final Office Action for U.S. Appl. No. 12/054,011, dated Jun. 30, 2011.
Final Office Action for U.S. Appl. No. 12/115,651, dated Jan. 6, 2012.
Final Office Action for U.S. Appl. No. 12/199,467, dated Jan. 18, 2012.
Final Office Action for U.S. Appl. No. 12/199,467, dated Sep. 9, 2013.
Final Office Action for U.S. Appl. No. 12/730,782, dated May 13, 2013.
Final Office Action dated Dec. 7, 2010 for U.S. Appl. No. 12/054,011.
Final Office Action regarding U.S. Appl. No. 12/199,467, dated Apr. 7, 2014.
Final Office Action regarding U.S. Appl. No. 09/977,552, dated Oct. 22, 2008.
Final Office Action regarding U.S. Appl. No. 09/977,552, dated Apr. 26, 2004.
Final Office Action regarding U.S. Appl. No. 09/977,552, dated May 13, 2005.
Final Office Action regarding U.S. Appl. No. 09/977,552, dated Jun. 18, 2003.
Final Office Action regarding U.S. Appl. No. 09/977,552, dated Jul. 23, 2007.
Final Office Action regarding U.S. Appl. No. 11/098,575, dated Jun. 17, 2010.
Final Office Action regarding U.S. Appl. No. 12/261,643, dated Jun. 27, 2012.
Final Office Action regarding U.S. Appl. No. 12/261,643, dated Sep. 16, 2013.
Final Office Action regarding U.S. Appl. No. 12/261,643, dated Jul. 7, 2011.
First Chinese Office Action regarding Application No. 201180054123.8, dated Feb. 4, 2015. Translation provided by Unitalen Attorneys at Law.
First Chinese Office Action regarding Application No. 201310322522.9, dated Mar. 24, 2015. Translation provided by Unitalen Attorneys at Law.
First Examination Report regarding Australian Patent Application No. 2012241185, dated Sep. 27, 2013.
First Office Action from the Patent Office of the People's Republic of China regarding Application No. 200510005907.8, dated Jun. 29, 2007.
First Office Action from the State Intellectual Property Office of People's Republic of China regarding Chinese Patent Application No. 20120063131.5, dated Feb. 27, 2014. Translation provided by Liu, Shen & Associates.

(56) References Cited

OTHER PUBLICATIONS

First Office Action from the State Intellectual Property Office of People's Republic of China regarding Chinese Patent Application No. 201210062451.9, dated Mar. 5, 2014. Translation provided by Liu, Shen & Associates.
First Office Action from the State Intellectual Property Office of People's Republic of China regarding Chinese Patent Application No. 201210063686.X, dated Mar. 19, 2014. Translation provided by Liu, Shen & Associates.
First Office Action from The State Intellectual Property Office of the People's Republic of China regarding Chinese Patent Application No. 200890100287.3, dated Oct. 25, 2010. Translation provided by Unitalen Attorneys at Law.
First Office Action issued by the Chinese Patent Office for Application No. 200480015875.3, dated Sep. 5, 2008.
First Office Action issued by the Chinese Patent Office dated May 30, 2008 regarding Application No. 200580013451.8, 8 Pages. Translation provided by CCPIT Patent and Trademark Law Office.
First Office Action issued by the Chinese Patent Office regarding Application No. 200780030810.X dated Dec. 25, 2009.
First Office Action received from the Mexican Institute of Industrial Property (IMPI) regarding Application No. PA/a/2006/004561, dated Jun. 24, 2009. Summary provided by Goodrich, Riquelme y Asociados.
First Office Action regarding Chinese Application No. 200880106319.5, dated May 25, 2011. English translation provided by Unitalen Attorneys at Law.
First Office Action regarding Chinese Application No. 201080013757.4, dated Sep. 2, 2013, and Search Report. English translation provided by Unitalen Attorneys at Law.
First Office Action regarding Chinese Patent Application No. 200780032977.X, dated Sep. 27, 2010. English translation provided by Unitalen Attorneys at Law.
First Office Action regarding Chinese Patent Application No. 200880015473.1, dated May 23, 2011. English translation provided by Unitalen Attorneys at Law.
First Office Action regarding Chinese Patent Application No. 200880104495.5, dated Apr. 19, 2011. English translation provided by Unitalen Attorneys at Law.
First Office Action regarding Chinese Patent Application No. 200910211779.0, dated May 3, 2012. English translation provided by Unitalen Attorneys at Law.
First Office Action regarding Chinese Patent Application No. 201010117657.8, dated Dec. 29, 2010. English translation provided by Unitalen Attorneys at Law.
Fourth Office Action from the State Intellectual Property Office of People's Republic of China regarding Chinese Patent Applicaiton No. 200510005907.8, dated Dec. 8, 2011. Translation provided by Unitalen Attorneys at Law.
International Preliminary Report on Patentability dated Nov. 10, 2009 regarding International Application No. PCT/US2008/005971.
International Preliminary Report on Patentability for International Application No. PCT/US2008/009618, dated Mar. 24, 2010.
International Preliminary Report on Patentability for International Application No. PCT/US2008/012362, dated May 4, 2010.
International Preliminary Report on Patentability for International Application No. PCT/US2008/012364, dated May 4, 2010.
International Preliminary Report on Patentability regarding Application No. PCT/US2010/028667, dated Sep. 27, 2011.
International Preliminary Report on Patentability regarding International Application No. PCT/US2007/019563 dated Mar. 10, 2009.
International Preliminary Report on Patentability regarding International Application No. PCT/US2008/010228 dated Mar. 2, 2010.
International Search Report for International Application No. PCT/US04/43859, dated Mar. 2, 2006.
International Search Report for International Application No. PCT/US2005/11154, dated Oct. 19, 2005.
International Search Report for International Application No. PCT/US2007/016135 dated Oct. 22, 2007.
International Search Report for International Application No. PCT/US2008/009618, dated Dec. 8, 2008.
International Search Report for International Application No. PCT/US2008/012362, dated Feb. 12, 2009.
International Search Report for International Application No. PCT/US2008/012364 dated Mar. 13, 2009.
International Search Report regarding Application No. PCT/US2010/028667, dated Oct. 28, 2010.
International Search Report regarding Application No. PCT/US2011/060135, dated Apr. 10, 2012.
International Search Report regarding Application No. PCT/US2013/021161, dated May 8, 2013.
International Search Report regarding International Application No. PCT/US2008/005971 dated Sep. 30, 2008.
International Search Report regarding International Application No. PCT/US2008/010228 dated Feb. 3, 2009.
Interview Summary regarding U.S. Appl. No. 11/098,582, dated Apr. 27, 2010.
Non-Final Office Action for U.S. Appl. No. 11/098,575 dated Jan. 27, 2010.
Non-Final Office Action for U.S. Appl. No. 11/134,130, dated Dec. 19, 2008.
Non-Final Office Action for U.S. Appl. No. 11/134,130, dated Jun. 18, 2010.
Non-Final Office Action for U.S. Appl. No. 11/134,130, dated Oct. 23, 2009.
Non-Final Office Action for U.S. Appl. No. 11/776,879, dated Mar. 16, 2012.
Non-Final Office Action for U.S. Appl. No. 12/054,011, dated Oct. 20, 2011.
Non-Final Office Action for U.S. Appl. No. 12/054,011, dated Apr. 10, 2012.
Non-final Office Action for U.S. Appl. No. 12/115,651, dated Aug. 11, 2011.
Non-Final Office Action for U.S. Appl. No. 12/199,467, dated Jul. 29, 2011.
Non-Final Office Action for U.S. Appl. No. 12/199,467, dated May 20, 2013.
Non-Final Office Action for U.S. Appl. No. 12/199,467, dated Dec. 26, 2013.
Non-Final Office Action for U.S. Appl. No. 12/685,375, dated Aug. 6, 2012.
Non-Final Office Action for U.S. Appl. No. 12/730,782, dated Oct. 24, 2012.
Non-Final Office Action for U.S. Appl. No. 13/030,549, dated Nov. 5, 2012.
Non-Final Office Action in U.S. Appl. No. 11/850,846, dated May 24, 2013.
Non-Final Office Action in U.S. Appl. No. 12/685,375, dated Jan. 19, 2012.
Non-Final Office Action dated Mar. 3, 2011 for U.S. Appl. No. 12/054,011.
Non-Final Office Action dated Aug. 13, 2010 for U.S. Appl. No. 12/054,011.
Non-Final Office Action regarding U.S. Appl. No. 11/850,846, dated Apr. 24, 2012.
Non-Final Office Action regarding U.S. Appl. No. 13/770,123, dated Jul. 3, 2013.
Non-Final Office Action regarding U.S. Appl. No. 12/261,643, dated Jan. 27, 2011.
Non-Final Office Action regarding U.S. Appl. No. 13/176,021, dated May 8, 2012.
Non-Final Office Action regarding U.S. Appl. No. 121261,643, dated Mar. 12, 2013.
Notice of Allowance and Fees Due and Notice of Allowability regarding U.S. Appl. No. 11/098,582, dated Feb. 24, 2009.
Notice of Allowance and Fees Due and Notice of Allowability regarding U.S. Appl. No. 11/098,582, dated Sep. 24, 2010.
Notice of Allowance and Fees Due for U.S. Appl. No. 11/474,865, dated Sep. 8, 2009.
Notice of Allowance regarding U.S. Appl. No. 11/776,879, dated Jul. 9, 2012.

(56) References Cited

OTHER PUBLICATIONS

Notice of Allowance regarding U.S. Appl. No. 12/261,677, dated Dec. 15, 2011.
Notice of Panel Decision from Pre-Appeal Brief Review regarding U.S. Appl. No. 09/977,552, dated Aug. 4, 2009.
Notification of First Office Action from the State Intellectual Property Office of People's Republic of China regarding Chinese Patent Application No. 200880122964.6, dated Nov. 5, 2012. Translation provided by Unitalen Attorneys at Law.
Notification of the First Office Action received from State Intelectual Property Office of P.R.C., translated by Liu, Shen & Associates, Sep. 30, 2009.
Office Action Communication regarding U.S. Appl. No. 09/977,552, dated Apr. 18, 2007.
Office Action dated Aug. 13, 2007 regarding U.S. Appl. No. 11/134,130.
Office Action dated Dec. 21, 2007 regarding U.S. Appl. No. 11/134,130.
Office Action dated Feb. 23, 2007 regarding U.S. Appl. No. 11/134,130.
Office Action dated Jul. 9, 2008 regarding U.S. Appl. No. 11/134,130.
Office Action for U.S. Appl. No. 11/405,021 dated Sep. 3, 2009.
Office Action for U.S. Appl. No. 11/405,021, dated Mar. 24, 2009.
Office Action for U.S. Appl. No. 11/405,021, dated Aug. 20, 2008.
Office Action for U.S. Appl. No. 11/405,021, dated Sep. 3, 2009.
Office Action for U.S. Appl. No. 11/474,798, dated Jan. 24, 2008.
Office Action for U.S. Appl. No. 11/474,798, dated Jan. 3, 2007.
Office Action for U.S. Appl. No. 11/474,798, dated Oct. 10, 2008.
Office Action for U.S. Appl. No. 11/474,798, dated Oct. 19, 2009.
Office Action for U.S. Appl. No. 11/474,798, dated Mar. 31, 2009.
Office Action for U.S. Appl. No. 11/474,798, dated Jul. 10, 2007.
Office Action for U.S. Appl. No. 11/474,821 dated Dec. 12, 2008.
Office Action for U.S. Appl. No. 11/474,821 dated May 28, 2008.
Office Action for U.S. Appl. No. 11/474,821 dated Aug. 6, 2009.
Office Action for U.S. Appl. No. 11/474,821 dated Sep. 19, 2007.
Office Action for U.S. Appl. No. 11/474,821, dated Dec. 12, 2008.
Office Action for U.S. Appl. No. 11/474,821, dated May 28, 2008.
Office Action for U.S. Appl. No. 11/474,821, dated Aug. 6, 2009.
Office Action for U.S. Appl. No. 11/474,821, dated Sep. 19, 2007.
Office Action for U.S. Appl. No. 11/474,865 dated Jan. 23, 2008.
Office Action for U.S. Appl. No. 11/474,865 dated Nov. 28, 2006.
Office Action for U.S. Appl. No. 11/474,865 dated Mar. 13, 2009.
Office Action for U.S. Appl. No. 11/474,865 dated Jun. 5, 2007.
Office Action for U.S. Appl. No. 11/474,865 dated Sep. 18, 2008.
Office Action for U.S. Appl. No. 11/474,865, dated Jan. 23, 2008.
Office Action for U.S. Appl. No. 11/474,865, dated Nov. 28, 2006.
Office Action for U.S. Appl. No. 11/474,865, dated Mar. 13, 2009.
Office Action for U.S. Appl. No. 11/474,865, dated Jun. 5, 2007.
Office Action for U.S. Appl. No. 11/474,865, dated Sep. 15, 2008.
Office Action regarding Chinese Patent Application No. 200610076166.7, dated Jul. 24, 2009. Translation provided by Liu, Shen & Associates.
Office Action regarding Chinese Patent Application No. 201080013757.4, dated Apr. 16, 2014. Translation provided by Unitalen Attorneys at Law.
Office Action regarding Chinese Patent Application No. 201180054123.8, dated Oct. 10, 2015. Translation provided by Unitalen Attorneys at Law.
Office Action regarding Chinese Patent Application No. 201210024940.5, dated Aug. 18, 2014. Translation provided by Liu, Shen & Associates.
Office Action regarding European Patent Application No. 07 02 0596, dated May 4, 2015.
Office Action regarding India Patent Application No. 359/KOL/2006, dated Dec. 10, 2014.
Office Action regarding Korean Patent Application No. 10-2011-7021652, dated Jan. 7, 2013. Translation provided by Y.S. Chang and Associates.
Office Action regarding Mexico Patent Application No. MX/a/2009/011429, dated Aug. 8, 2011. Summary provided by Goodrich, Riquelme y Asociados.
Office Action regarding Russia Application No. 2013125314 dated Jun. 10, 2014. Translation provided by Gowlings International Inc.
Office Action regarding Russia Application No. 2013125314 dated Nov. 14, 2014. Translation provided by Gowlings International Inc.
Office Action regarding Taiwan Patent Application No. 095114093, dated Jul. 23, 2012. Summary provided by Saint Island International Patent & Law Offices.
Office Action regarding Taiwan Patent Application No. 095114093, dated Jun. 27, 2013. Summary provided by Saint Island International Patent & Law Offices.
Office Action regarding U.S. Appl. No. 11/098,575, dated Jan. 29, 2009.
Office Action regarding U.S. Appl. No. 11/098,575, dated Mar. 26, 2008.
Office Action regarding U.S. Appl. No. 11/098,575, dated Jul. 13, 2009.
Office Action regarding U.S. Appl. No. 11/098,575, dated Sep. 9, 2008.
Office Action regarding U.S. Appl. No. 12/199,467, dated May 20, 2013.
Office Action regarding U.S. Appl. No. 13/930,403, dated Jun. 26, 2015.
Office Action regarding U.S. Appl. No. 09/977,552, dated Jan. 11, 2008.
Office Action regarding U.S. Appl. No. 09/977,552, dated Jan. 14, 2003.
Office Action regarding U.S. Appl. No. 09/977,552, dated Oct. 18, 2004.
Office Action regarding U.S. Appl. No. 09/977,552, dated Dec. 3, 2003.
Office Action regarding U.S. Appl. No. 09/977,552, dated Jul. 12, 2006.
Office Action regarding U.S. Appl. No. 11/098,582 dated Mar. 3, 2010.
Office Action regarding U.S. Appl. No. 11/098,582, dated Jul. 7, 2008.
Office Action regarding U.S. Appl. No. 11/098,582, dated Aug. 4, 2009.
Office Action regarding U.S. Appl. No. 11/098,582, dated Sep. 21, 2007.
Office Action regarding U.S. Appl. No. 11/405,021, dated Feb. 2, 2011.
Office Action regarding U.S. Appl. No. 11/776,879, dated Sep. 17, 2010.
Office Action regarding U.S. Appl. No. 11/850,846, dated Aug. 13, 2010.
Office Action regarding U.S. Appl. No. 12/261,643, dated Nov. 2, 2011.
Office Action regarding U.S. Appl. No. 12/261,643, dated Feb. 15, 2012.
Office Action regarding U.S. Appl. No. 12/261,677, dated Aug. 4, 2011.
Official Action regarding Australian Patent Application No. 2008325240, dated Jan. 19, 2011.
Partial European Search Report dated Sep. 2, 2009 regarding Application No. EP05256767.
Partial European Search Report for Application No. EP06252199, dated Oct. 19, 2006.
Patent Examination Report No. 3 regarding Australian Patent Application No. 2008325240, dated Jul. 19, 2012.
Record of Oral Hearing regarding U.S. Appl. No. 09/977,552, dated Nov. 29, 2012.
Refrigeration Monitor and Case Control Installation and Operation Manual, Computer Process Controls, Aug. 12, 1999.
Reissued Office Action regarding U.S. Appl. No. 13/930,403, dated Jul. 23, 2015.
Response to Rule 312 Communication regarding U.S. Appl. No. 09/977,552, dated Oct. 31, 2003.

(56) References Cited

OTHER PUBLICATIONS

Search Report regarding Chinese Patent Application No. 201180054123.8, dated Jan. 27, 2015. Translation provided by Unitalen Attorneys at Law.
Search Report regarding European Patent Application No. 01301752.0-1267, dated Apr. 18, 2002.
Search Report regarding European Patent Application No. 02251531.6, dated Oct. 16, 2002.
Search Report regarding European Patent Application No. 10756845.3-1608 / 2414677 PCT/US2010028667, dated Jun. 19, 2015.
Second Office Action from the State Intellectual Property Office for People's Republic of China regarding Chinese Application No. 201210062451.9, dated Aug. 20, 2014. Translation provided by Liu, Shen & Associates.
Second Office Action from the State Intellectual Property Office from People's Republic of China regarding Chinese Patent Application No. 201210063686X, dated Oct. 31, 2014. Translation provided by Liu, Shen & Associates.
Second Office Action issued by the Chinese Patent Office dated Jun. 19, 2009 regarding Application No. 200510005907.8, translation provided by CCPIT Patent and Trademark Law Office.
Second Office Action issued by the Chinese Patent Office for Application No. 200480015875.3, dated Feb. 27, 2009.
Second Office Action issued by the Chinese Patent Office dated Mar. 6, 2009 regarding Application No. 200580013451.8, 7 Pages. Translation provided by CCPIT Patent and Trademark Law Office.
Second Office Action regarding Chinese Application No. 201080013757.4, dated Apr. 16, 2014, and Supplementary Search Report. English translation provided by Unitalen Attorneys at Law.
Second Office Action regarding Chinese Patent Application No. 200780030810X, dated Aug. 4, 2010. English translation provided by Unitalen Attorneys at Law.
Second Office Action regarding Chinese Patent Application No. 200890100287.3, dated Jan. 27, 2011. English translation provided by Unitalen Attorneys at Law.
Second Office Action regarding Chinese Patent Application No. 200910211779.0, dated Feb. 4, 2013. English translation provided by Unitalen Attorneys at Law.
Second Office Action regarding Chinese Patent Application No. 201310322522.9, dated Sep. 22, 2015. Translation provided by Unitalen Attorneys at Law.
Summary of the First Office Action received from the Mexican Institute of Industrial Property (IMPI) regarding Application No. PA/a/2006/004561. Summary provided by Goodrich, Riquelme y Asociados dated Sep. 17, 2009.
Summary of the Fourth Office Action received from the Mexican Institute of Industrial Property (IMPI) regarding Application No. PA/a/2006/005167. Summary provided by Goodrich, Riquelme y Asociados dated Mar. 25, 2010.
Summary of the Second Office Action received from the Mexican Institute of Industrial Property (IMPI) regarding Application No. PA/a/2006/005167. Summary provided by Goodrich, Riquelme y Asociados dated Mar. 20, 2009.
Summary of the Third Office Action received from the Mexican Institute of Industrial Property (IMPI) regarding Application No. PA/a/2006/005167. Summary provided by Goodrich, Riquelme y Asociados dated Sep. 3, 2009.
The International Search Report regarding International Application No. PCT/US2007/019563, dated Jan. 15, 2008.
Third Office Action issued by the Chinese Patent Office dated Jun. 19, 2009 regarding Application No. 200580013451.8, translated by CCPIT Patent and Trademark Law Office.
Third Office Action regarding Chinese Application No. 2005100059078 from the State Intellectual Property Office of People's Republic of China, dated Aug. 24, 2011. Translation provided by Unitalen Attorneys at Law.
Third Office Action regarding Chinese Patent Application No. 200910211779.0, dated Sep. 4, 2013. English translation provided by Unitalen Attorneys at Law.
Translation of claims and Abstract of KR Patent Laying-Open No. 2000-0000261.
Ultrasite 32 User's Guide, Computer Process Controls, Sep. 28, 1999.
Ultrasite User's Guide BCU Supplement, Computer Process Controls, Sep. 4, 1997.
Ultrasite User's Guide BEC Supplement, Computer Process Controls, Oct. 6, 1997.
Ultrasite User's Guide RMCC Supplement, Computer Process Controls, Jun. 9, 1997.
Written Opinion of International Searching Authority for International Application No. PCT/US2008/009618, dated Dec. 8, 2008.
Written Opinion of the International Searching Authority for International Application No. PCT/US2008/012364 dated Mar. 12, 2009.
Written Opinion of the International Searching Authority regarding Application No. PCT/US2010/028667, dated Oct. 28, 2010.
Written Opinion of the International Searching Authority regarding Application No. PCT/US2011/060135, dated Apr. 10, 2012.
Written Opinion of the International Searching Authority regarding Application No. PCT/US2013/021161, dated May 8, 2013.
Written Opinion of the International Searching Authority regarding International Application No. PCT/US2007/019563, dated Jan. 15, 2008.
Written Opinion of the International Searching Authority regarding International Application No. PCT/US2008/005971 dated Sep. 30, 2008.
Written Opinion of the International Searching Authority regarding International Application No. PCT/US2008/010228 dated Feb. 3, 2009.
Office Action regarding Chinese Patent Application No. 201610222048.6, dated Feb. 22, 2017. Translation provided by Unitalen Attorneys at Law.
Office Action regarding U.S. Appl. No. 15/130,326, dated Aug. 16, 2017.
Office Action regarding Chinese Patent Application No. 201610222048.6, dated Nov. 16, 2017. Translation provided by Unitalen Attorneys at Law.
Office Action regarding U.S. Appl. No. 15/130,326, dated Jan. 8, 2018.
Office Action regarding U.S. Appl. No. 12/730,782, dated Feb. 21, 2014.
Office Action regarding U.S. Appl. No. 13/293,201, dated Oct. 6, 2014.
Office Action regarding U.S. Appl. No. 13/293,201, dated May 6, 2015.
Office Action regarding U.S. Appl. No. 13/293,201, dated Jul. 14, 2015.
Office Action regarding U.S. Appl. No. 13/293,201, dated Dec. 31, 2015.
Office Action regarding U.S. Appl. No. 13/293,201, dated Mar. 21, 2016.
Search Report regarding European Patent Application No. 11839141.6, dated Oct. 24, 2017.

\* cited by examiner

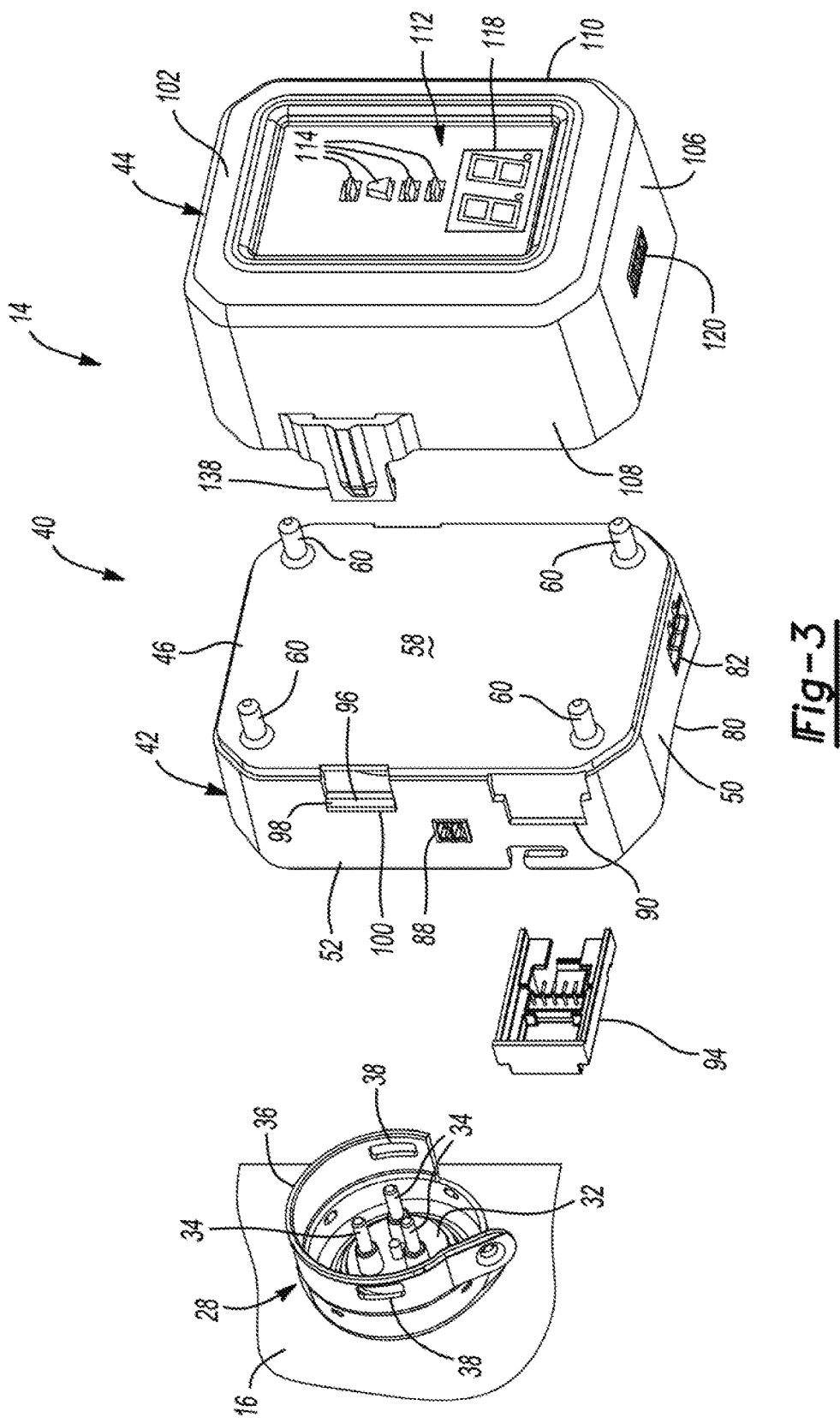

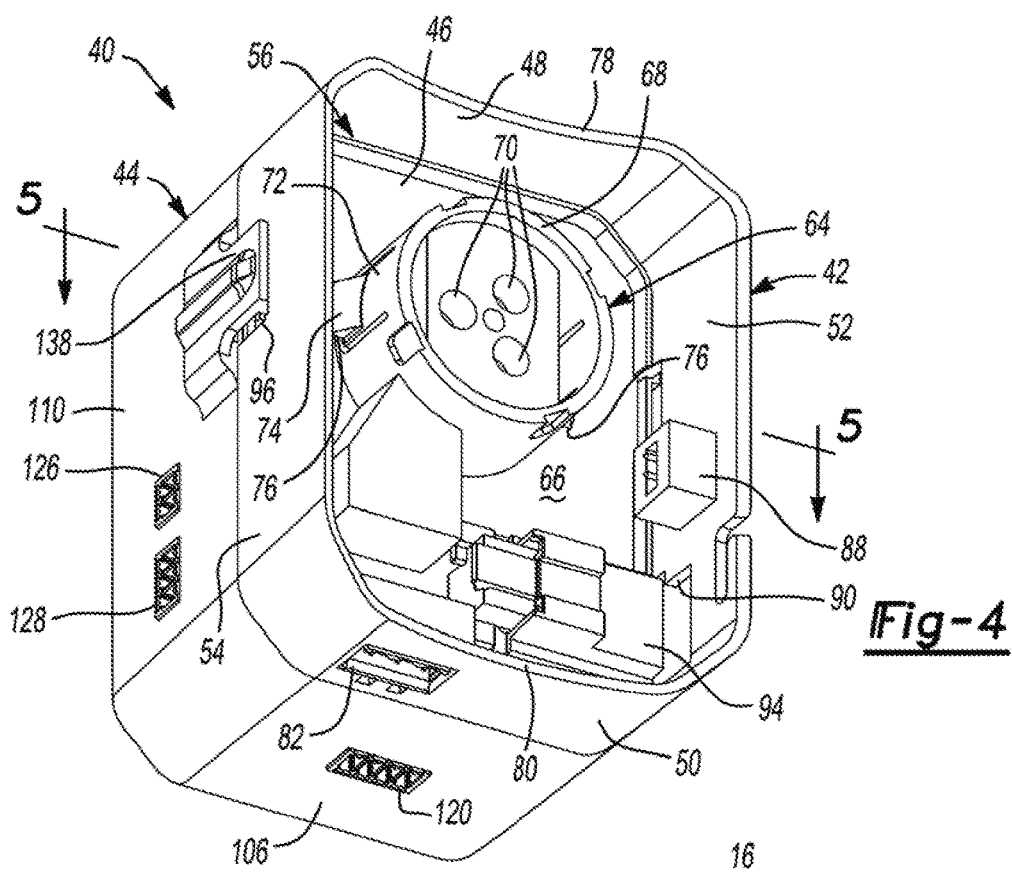

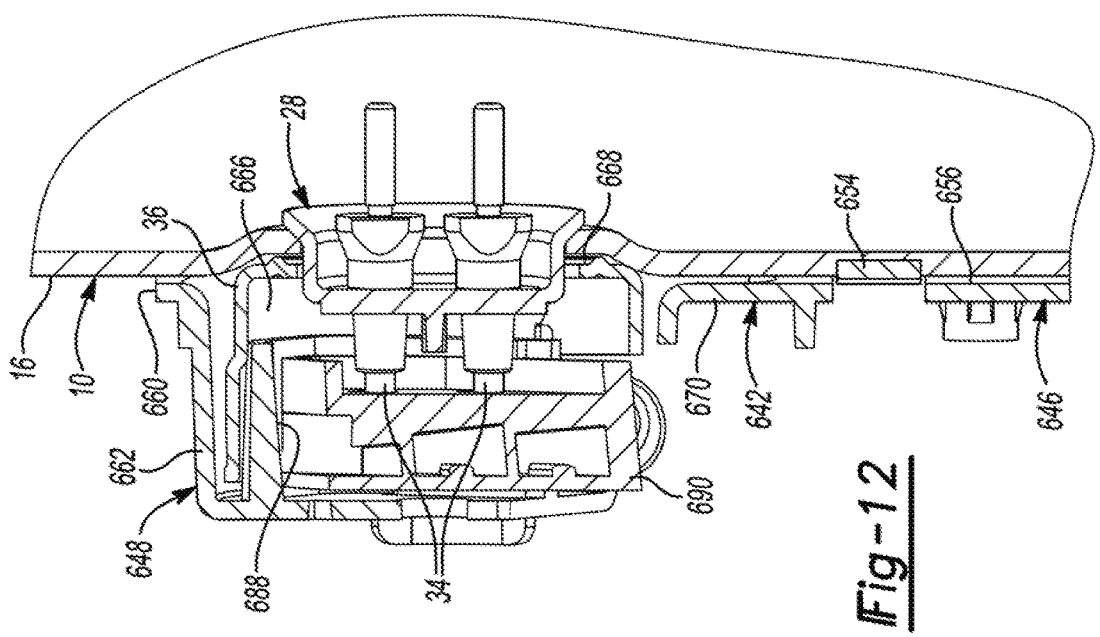
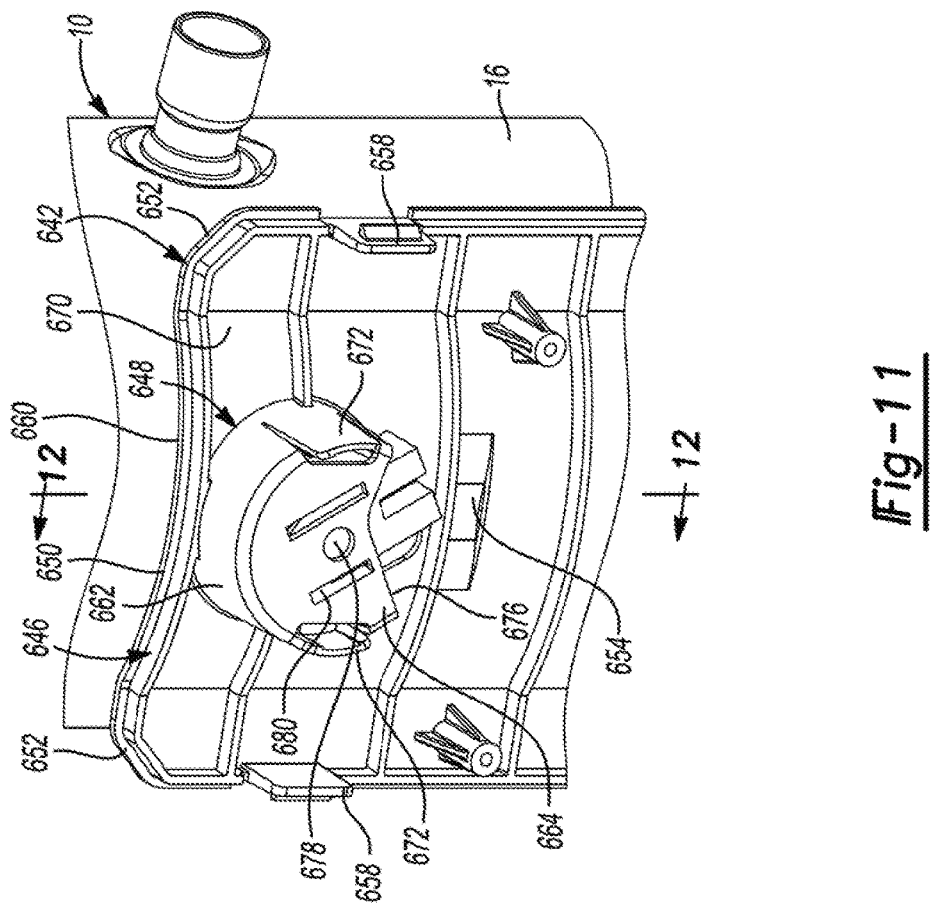

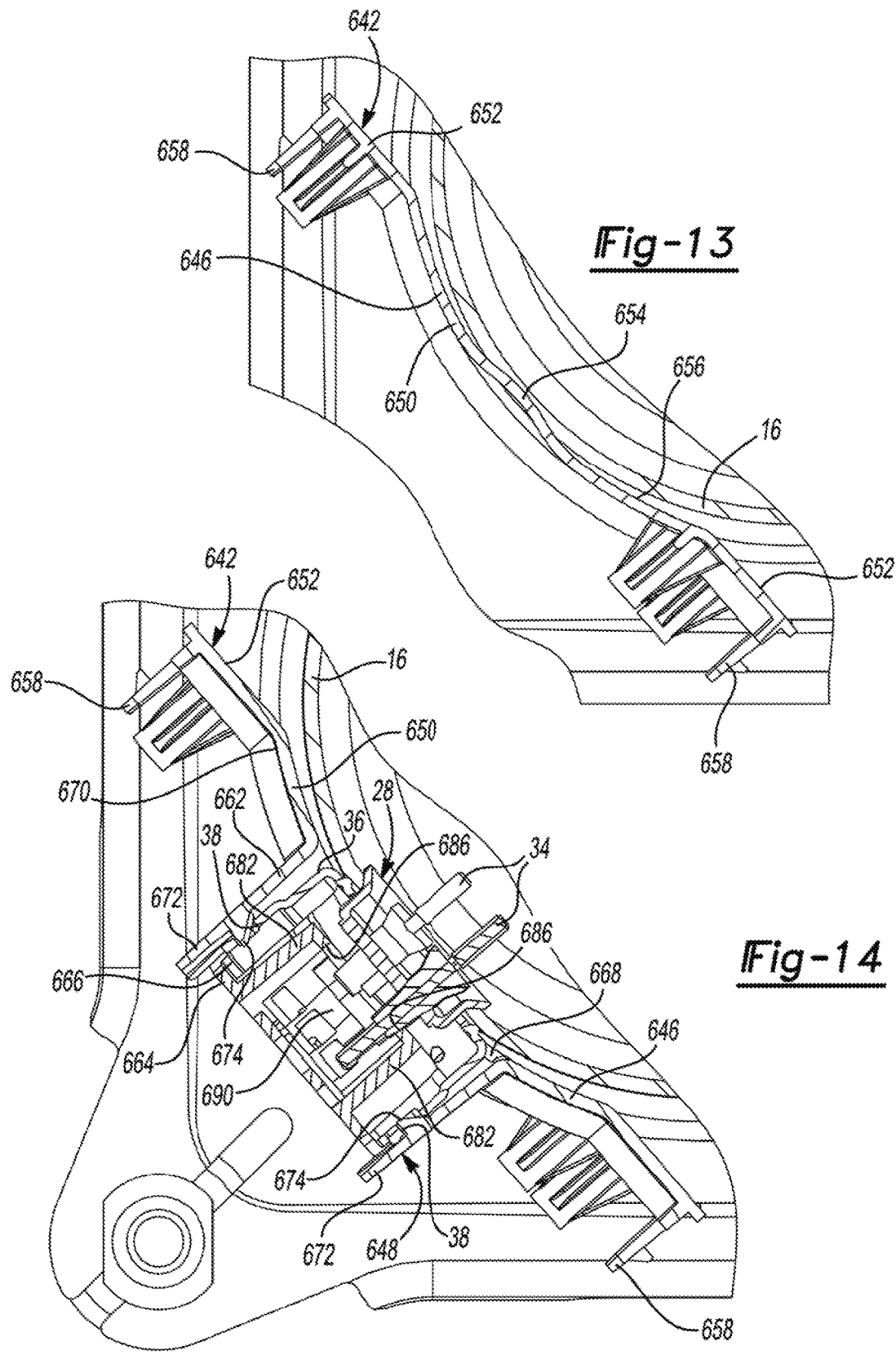

COMPRESSOR PROTECTION MODULE

CROSS-REFERENCE TO RELATED APPLICATIONS

This application is a continuation of U.S. patent application Ser. No. 13/930,403, filed Jun. 28, 2013, which claims the benefit and priority of Indian Patent Application No. 756MUM2013, filed Mar. 13, 2013, and U.S. Provisional Patent Application No. 61/676,581, filed Jul. 27, 2012. The entire disclosures of each of the above applications are incorporated herein by reference.

FIELD

The present disclosure relates to a compressor protection module.

BACKGROUND

This section provides background information related to the present disclosure and is not necessarily prior art.

Compressors are used in a variety of industrial and residential applications to circulate a working fluid within a refrigeration, heat pump, HVAC, or chiller system (generically, "climate control systems") to provide a desired heating or cooling effect. A typical climate control system may include a fluid circuit having an outdoor heat exchanger, an indoor heat exchanger, an expansion device disposed between the indoor and outdoor heat exchangers, and a compressor circulating a working fluid (e.g., refrigerant or carbon dioxide) between the indoor and outdoor heat exchangers. It is desirable for the compressor to provide consistent and efficient operation to ensure that the climate control system functions properly. To this end, a compressor may be operated with an associated protection and control device.

The protection and control device may monitor operating signals generated by compressor or climate control system sensors and determine compressor or climate control system operating data. For example, the protection and control device may determine whether compressor and/or climate control system faults have occurred. The compressor and/or climate control system may be controlled based on this information. The protection and control device may provide diagnostic information to a user or service technician.

SUMMARY

This section provides a general summary of the disclosure, and is not a comprehensive disclosure of its full scope or all of its features.

In one form, the present disclosure provides an electronic device that may include a housing and an electronic component disposed within the housing. The housing may include a plug configured to engage a terminal assembly extending from a compressor shell and facilitate electrical communication between the plug and the terminal assembly. An exterior surface of the housing may include one or more receptacles extending therethrough in electrical communication with the electronic component.

In some embodiments, the plug may include a plug body and a plurality of resiliently flexible tabs configured to snap into engagement with corresponding apertures in a fence of the terminal assembly. The plug body may include a plurality of apertures configured to receive conductor pins of the terminal assembly.

In some embodiments, the electronic component may include at least one of a protection module, a control module and a diagnostic module.

In some embodiments, the housing may include a base and a removable cap. The cap may include a plurality of resiliently flexible tabs that snap into engagement with the base. The removable cap may include a display device in communication with the electronic component.

In some embodiments, the one or more receptacles may be in electrical communication with a display device disposed remotely from the housing. In some embodiments, the display device may include an interactive feature.

In some embodiments, the housing may be adapted to selectively engage a first cap having an integral display device and a second cap that is in electrical communication with a remote display device.

In some embodiments, the electronic device may include a non-volatile memory device engaging the housing.

In another form, the present disclosure provides a set of components that may include a base, an electronic component, a first cap and a second cap. The base may be adapted to be mounted to a compressor and may include a first engagement feature and a first receptacle adapted to receive an electrical connector. The electronic component may be disposed within the base. The first cap may include an integral display device and a second engagement feature configured to engage the first engagement feature to secure the first cap to the base. The integral display device may be in communication with the electronic device when the first cap is engaged with the base. The second cap may include a third engagement feature configured to engage the first engagement feature to secure the second cap to the base. The second cap may include a second receptacle providing communication between the electronic component and a remote display device.

In some embodiments, only one of the first and second caps is secured to the base at any given time and the one of the first and second caps may be chosen based on a system-level specification.

In some embodiments, the second engagement feature may be similar or identical in shape and size as the third engagement feature.

In some embodiments, the base may include a plug configured to engage a terminal assembly extending outward from a compressor shell for electrical communication between the plug and the terminal assembly. The plug may include a plug body and a plurality of resiliently flexible tabs configured to snap into engagement with corresponding apertures in a fence of the terminal assembly. The plug body may include a plurality of apertures configured to receive conductor pins of the terminal assembly.

In some embodiments, the base may be a part of at least one of a protection module, a control module and a diagnostic module.

In some embodiments, the second and third engagement features may be identical to each other.

In some embodiments, the second and third engagement features may include resiliently flexible tabs.

In some embodiments, the set of components may also include a non-volatile memory received in the base.

In yet another form, the present disclosure provides a method that may include providing a base including an electronic component, a first engagement feature and a first receptacle adapted to receive an electrical connector; mounting the base to a compressor. A first cap may be provided that includes an integral display device and a second engagement feature configured to engage the first engagement feature to secure the first cap to the base. The integral display device may be in communication with the electronic device when the first cap is engaged with the base. A second cap may be provided that includes a third engagement feature configured to engage the first engagement feature to secure the second cap to the base. The second cap may include a second receptacle providing communication between the electronic component and a remote display device. One of the first and second caps may be selected based on a system-level specification.

In some embodiments, mounting the base to the compressor may include connecting a plug extending from a surface of the base with a terminal assembly extending from a shell of the compressor.

In some embodiments, mounting the base to the compressor may include enclosing a terminal assembly of the compressor.

In some embodiments, the method may include displaying indicia of compressor operating conditions on one of the integral display device and the remote display device.

In some embodiments, the method may include mounting the remote display device on a wall of a condensing unit.

In some embodiments, the method may include inserting a non-volatile memory device into the base.

In yet another form, the present disclosure provides a compressor that may include a shell, a terminal assembly and an electronics module. The terminal assembly may engage the shell and may include an outwardly extending conductor and a terminal fence at least partially surrounding the conductor. The electronics module may include a back plate having an opening through which the terminal fence may be received. The back plate may include an engagement feature and a spring element. The engagement feature may removably engage the terminal fence. The spring element may contact the shell and bias the back plate away from the shell.

In some embodiments, the spring element may include a resiliently compressible annular gasket.

In some embodiments, the annular gasket may seal against the shell and the back plate.

In some embodiments, the spring element may include a strip integrally formed with the back plate and bulging outward therefrom toward the shell.

In some embodiments, the terminal fence may include a plurality of apertures. The engagement feature may include a plurality of flexible tabs having barbs engaging the apertures.

In some embodiments, the spring element may bias the barbs into engagement with edges of the apertures.

In some embodiments, the terminal fence may be received between the tabs.

In some embodiments, the back plate may include a receptacle including guide rails engaging a cluster block that is electrically connected to the conductor.

In some embodiments, the receptacle may include an opening through which the cluster block is removably received.

In yet another form, the present disclosure provides a compressor that may include a shell, a terminal assembly and an electronics module. The terminal assembly may engage the shell and may include an outwardly extending conductor and a terminal fence at least partially surrounding the conductor. The electronics module may include a back plate having an opening through which the terminal fence may be received. The back plate may include a receptacle and an engagement feature. The receptacle may receive the terminal fence and may include guide rails removably engaging a cluster block that is electrically connected to the conductor. The engagement feature may removably engage the terminal fence.

In some embodiments, the back plate may include a spring element contacting the shell and biasing the back plate away from the shell.

In some embodiments, the spring element may include a resiliently compressible annular gasket.

In some embodiments, the annular gasket may seal against the shell and the back plate.

In some embodiments, the spring element may include a strip integrally formed with the back plate and bulging outward therefrom toward the shell.

In some embodiments, the terminal fence may include a plurality of apertures. The engagement feature may include a plurality of flexible tabs having barbs engaging the apertures.

In some embodiments, the spring element may bias the barbs into engagement with edges of the apertures.

In some embodiments, the terminal fence may be received between the tabs.

In some embodiments, the back plate may include a receptacle supporting the guide rails.

In some embodiments, the receptacle may include an opening through which the cluster block may be removably received.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 3 is a partially exploded perspective view of the protection module and a terminal assembly of the compressor of FIG. 1;

FIG. 4 is a perspective view of the protection module;

FIG. 5 is a cross-sectional view of the protection module and a portion of the compressor;

FIG. 11 is a partial perspective view of the compressor and a back plate of the electronics module;

FIG. 12 is a partial cross-sectional view of the compressor and the back plate;

FIG. 13 is another partial cross-sectional view of the compressor and the back plate;

FIG. 14 is a yet another partial cross-sectional view of the compressor and the back plate;

Corresponding reference numerals indicate corresponding parts throughout the several views of the drawings.

DETAILED DESCRIPTION

Figure 1:
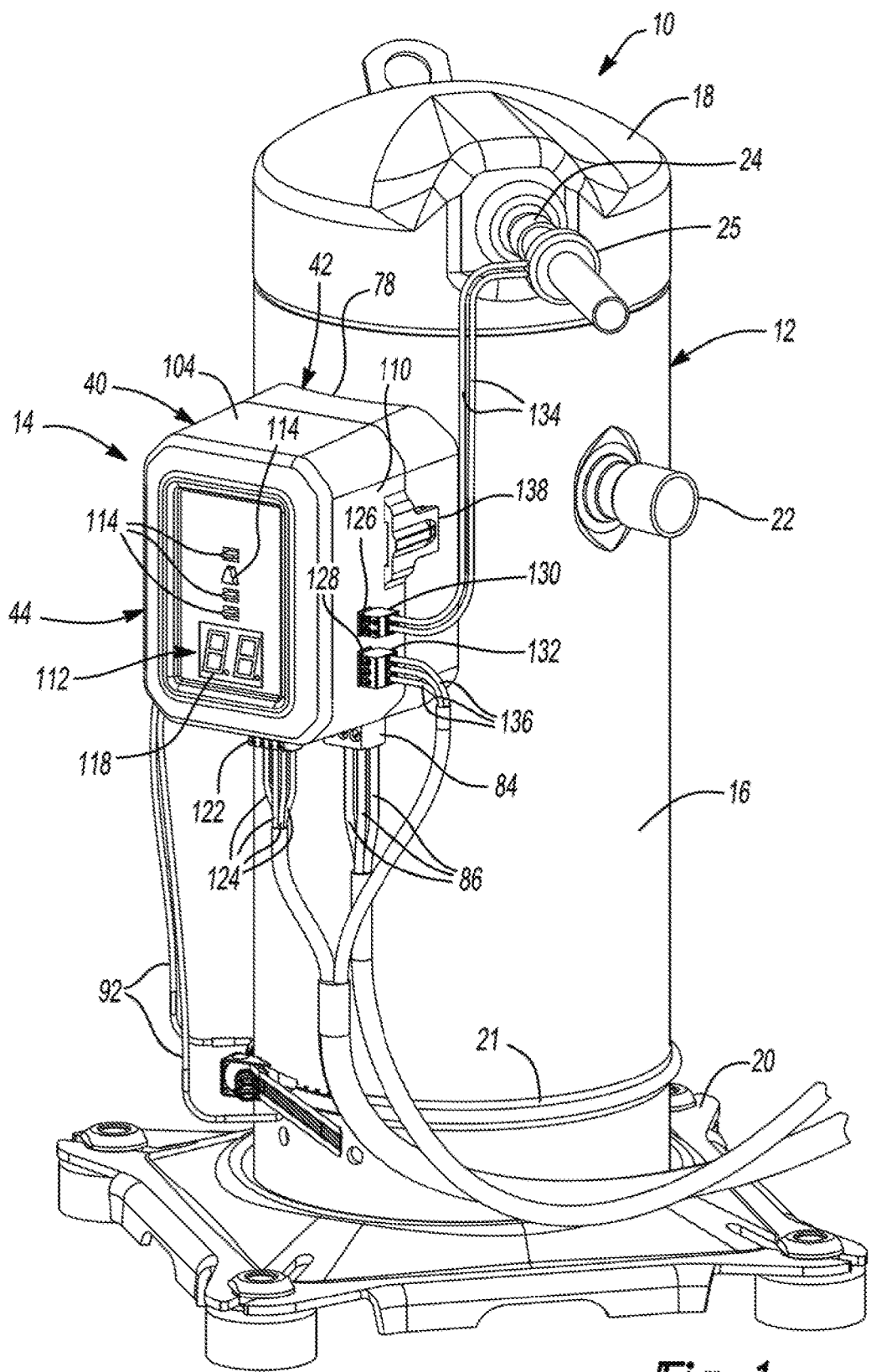
FIG. 1 is a perspective view of a compressor having a protection module according to the principles of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 2:
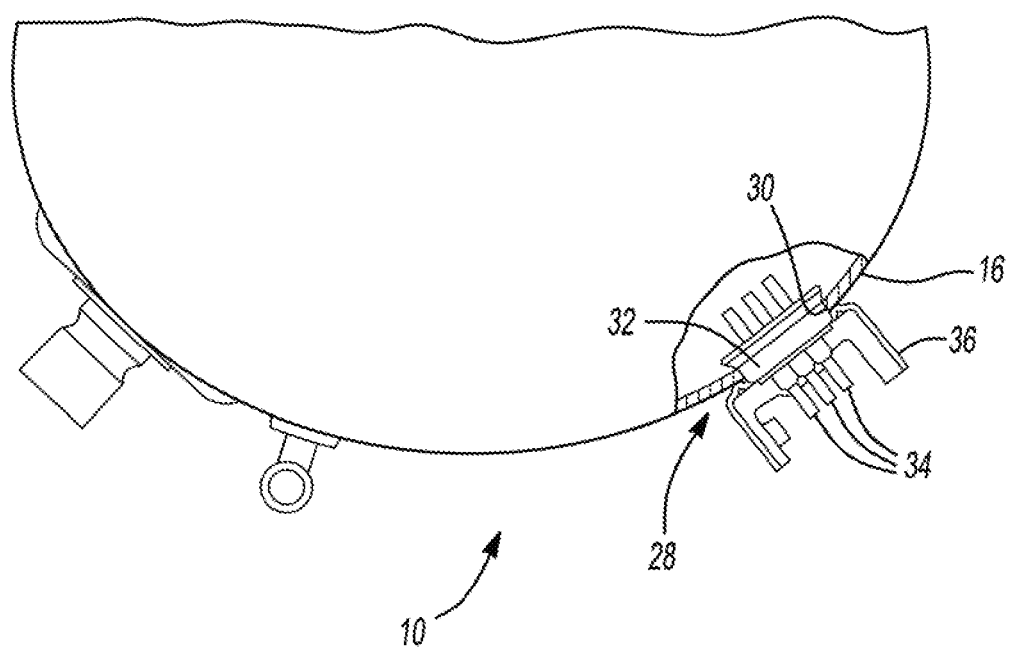
FIG. 2 is a partial cross-section of the compressor of FIG. 1.

With reference to FIGS. 1 and 2, a compressor 10 is provided that may include a hermetic shell assembly 12, a motor-driven compression mechanism (not shown) disposed within the shell assembly 12, and a protection module 14. The shell assembly 12 may form a compressor housing and may include a cylindrical shell 16, an end cap 18 at an upper end thereof, and a base 20 at a lower end thereof. A band heater 21 may be secured to the shell 16 near the base 20 and may be operable to warm the shell 16, oil disposed in an oil sump (not shown) within the shell assembly 12 and/or various compressor components. A suction inlet fitting 22 may extend outward from the shell 16 and may receive suction-pressure working fluid for subsequent compression by the compression mechanism. A discharge fitting 24 may be attached to shell 16 at an opening (not shown) in the end cap 18 and may receive discharge-pressure gas from the compression mechanism. A discharge-temperature sensor 25 may be disposed within the discharge fitting 24 or in a conduit downstream of the discharge fitting 24 and may measure a temperature of the discharge-pressure gas therein and communicate the measurement to the protection module 14. The compression mechanism could be any type of compression mechanism such as, for example, a scroll, reciprocating, rotary or any other type of compression mechanism.

Referring now to FIGS. 2 and 3, a hermetic terminal assembly 28 may be attached to the shell 16 at an opening 30 (FIG. 2). The terminal assembly 28 may facilitate electrical communication among the motor (not shown) of the compressor 10 and the protection module 14 and an external source of electrical power (not shown). The terminal assembly 28 may include a terminal body 32, a plurality of conductor pins 34, and a terminal fence 36. The terminal body 32 may be welded or otherwise sealingly disposed within the opening 30. The conductor pins 34 may extend outward from the terminal body 32. The terminal fence 36 may extend outward from the shell 16 and may at least partially surround the terminal body 32 and conductor pins

34. The terminal fence 36 may include a plurality of apertures 38 (FIG. 3) extending therethrough.

Referring now to FIGS. 1 and 3-5, the protection module 14 may include a housing 40 in which protection and control electronics are provided to protect and control the compressor 10 and/or diagnose faults of the compressor 10 and/or faults of a climate control system in which the compressor 10 may be operating. The protection and control electronics may monitor operating signals generated by sensors associated with the compressor 10 or the climate control system and determine compressor or climate control system operating data. For example, the protection and control electronics may determine an operating mode for the compressor 10 and may protect the compressor 10 by limiting operation when conditions are unfavorable.

The protection and control electronics may be of the type disclosed in assignee's commonly-owned U.S. Pat. Nos. 7,412,842 or 8,036,853, the disclosures of which are incorporated herein by reference. It is understood, however, that other suitable systems may be used. The protection and control electronics may include one or more of the following: an application specific integrated circuit (ASIC), an electronic circuit, a processor (shared, dedicated, or group) and memory that execute one or more software or firmware programs, a combinational logic circuit, or other suitable components that provide the described functionality.

The housing 40 of the protection module 14 may include a base 42 and a cap 44. The base 42 may include a body 46 and first, second, third and fourth sidewalls 48, 50, 52, 54 that cooperate with the body 46 to define a cavity 56 (FIG. 4). The body 46 may include an exterior side 58 having a plurality of posts 60 (FIG. 3) extending outward therefrom. The posts 60 may engage corresponding receptacles 62 (FIG. 5) in the cap 44 to align the cap 44 relative to the base 42. Contacts (not shown) may be provided on the cap 44 and the base 42 to provide electrical communication between components of the protection and control electronics disposed within the base 42 and components of the protection and control electronics disposed within the cap 44.

As shown in FIGS. 4 and 5, a terminal plug 64 may be attached to or integrally formed with an interior side 66 of the body 46. The terminal plug 64 may include a molded body 68 that house female-electrical receptacles 70 for receiving a respective conductor pin 34 for electrical communication therebetween. The plurality of receptacles 70 are equal in number to and arranged in the identical pattern as the conductor pins 34 of the terminal assembly 28. The receptacles 70 may be in electrical communication with the protection and control electronics. The body 68 may include a plurality of resiliently flexible tabs 72 each having a ramped surface 74 and an engagement surface 76. The ramped surface 74 and the engagement surface 76 cooperate to form a generally wedge-shaped body. As shown in FIG. 5, the tabs 72 may snap into engagement with the apertures 38 in the terminal fence 36 such that the engagement surfaces 76 abut edges of the apertures 38 to restrict or prevent removal of the terminal plug 64 from the terminal assembly 28. It will be appreciated that the terminal plug 64 may include additional or alternative structure to secure the terminal plug 64 and base 42 to the terminal assembly 28. In some embodiments, the terminal plug 64 may include a sealing member (not shown) to facilitate a sealed relationship between the terminal plug 64 and the terminal assembly 28.

As shown in FIGS. 3 and 4, the first and second sidewalls 48, 50 of the base 42 may include curved edges 78, 80, respectively, that have a radius approximately equal to a radius of the shell 16. In this manner, the sidewalls 48, 50, 52, 54 can be in intimate contact with the shell 16, and thereby enclose the terminal assembly 28 and the terminal plug 64 when the terminal assembly 28 and terminal plug 64 are connected to each other. The second sidewall 50 may also include an electrical receptacle 82 (FIGS. 3 and 4) that receives an electrical connector 84 (FIG. 1) to facilitate electrical communication between the protection and control electronics and wires 86 (FIG. 1) and/or electrical communication between the wires 86 and the terminal plug 64 and terminal assembly 28. The wires 86 could be power and/or communication wires, for example, that may be connected to a power source and/or one or more network/communication devices such as, for example, a handheld computing device, a system controller, or other suitable communication/network device.

The third sidewall 52 of the base 42 may include another electrical receptacle 88 (FIG. 3) and a memory chip slot 90. The electrical receptacle 88 may receive an electrical connector (not shown) to facilitate electrical communication between the protection and control electronics and wires 92 (FIG. 1). The wires 92 could supply electrical power to the band heater 21, for example.

The memory chip slot 90 may receive a non-volatile memory device 94 that may be in communication with the protection and control electronics and may store information for life-cycle tracking of the compressor 10 and/or the climate control system and operational data of the compressor 10 and/or the climate control system collected over the life of the compressor 10. The non-volatile memory device 94 may be a two kilobyte or four kilobyte erasable programmable read-only memory (EPROM) chip or an electrically erasable programmable read only memory (EEPROM) chip. For example, the non-volatile memory device 94 could be of the type disclosed in assignee's commonly-owned U.S. Pat. No. 7,412,842, the disclosure of which is hereby incorporated by reference. Other types and other sizes of memory devices may be utilized including flash memory, magnetic media, optical media, or other non-volatile memory suitable for storing data. Additionally or alternatively, the non-volatile memory device 94 may operable to communicate with a remote device via a Wi-Fi, Bluetooth™ or cellular network, for example.

Additionally or alternatively, an RFID (radio-frequency identification) device may be used. The RFID device may include non-volatile memory and may wirelessly communicate data. If an RFID device is used, the non-volatile memory device 94 may be a wireless data communication device that allows communication with the RFID device. As used herein, the term non-volatile memory is intended to refer to a memory in which the data content is retained when power is no longer supplied to it, such as an EPROM or EEPROM.

The third and fourth sidewalls 52, 54 of the base 42 may also include tabs 96 (FIGS. 3 and 5) each having a ramped surface 98 and an engagement surface 100. The ramped surface 98 and the engagement surface 100 cooperate to form a generally wedge-shaped body. The tabs 96 may engage the cap 44 of the housing 40 to secure the cap 44 to the base 42.

The cap 44 may include a body 102 and first, second, third and fourth sidewalls 104, 106, 108, 110. The body 102 may include a display device 112 attached thereto or integrated therein. The display device 112 may be in communication with the protection and control electronics and may display diagnostic information that a service technician may read and/or interpret when servicing or troubleshooting the compressor 10 and/or the climate control system. As shown in FIGS. 1 and 3, the display device 112 may include one or more LED's 114 and a numeric or alpha-numeric display screen 118. The display device 112 may display indicia of compressor and/or climate control system operating conditions on the screen 118. Additionally, one of more of the LED's 114 may illuminate to indicate a particular fault or operating condition.

The second sidewall 106 may include a receptacle 120 (FIGS. 3 and 4) that receives an electrical connector 122 (FIG. 1) to facilitate electrical communication between the protection and control electronics and wires 124 (FIG. 1). The wires 124 could provide electrical power to the protection module 14 and may be in communication with a thermostat (not shown), for example, and/or one or more other control devices of the climate control system in which the compressor 10 may be incorporated.

The fourth sidewall 110 may include additional receptacles 126, 128 (FIGS. 1 and 4) that receive electrical connectors 130, 132 (FIG. 1), respectively, to facilitate electrical communication between the protection and control electronics and wires 134, 136 (FIG. 1), respectively. The wires 134 may be in communication with the discharge-temperature sensor 25 or any other sensor measuring a compressor or climate control system operating parameter. The wires 136 could be communication output wires for providing communication between the protection and control electronics and a control device, a diagnostic device and/or a remote computer or other intelligent device, for example.

As shown in FIGS. 3 and 5, the third and fourth sidewalls 108, 110 may include resiliently flexible tabs 138 that snap into engagement with tabs 96 of the base 42. The flexible tabs 138 may each include a ramped surface 140 and an engagement surface 142. The ramped surface 140 and the engagement surface 142 cooperate to form a generally wedge-shaped body. Each of the engagement surfaces 142 abut a corresponding one of the engagement surfaces 100 of the tabs 96 of the base 42, as shown in FIG. 5. The engagement surfaces 100, 142 interfere with each other to secure the cap 44 to the base 42.

Figure 6:
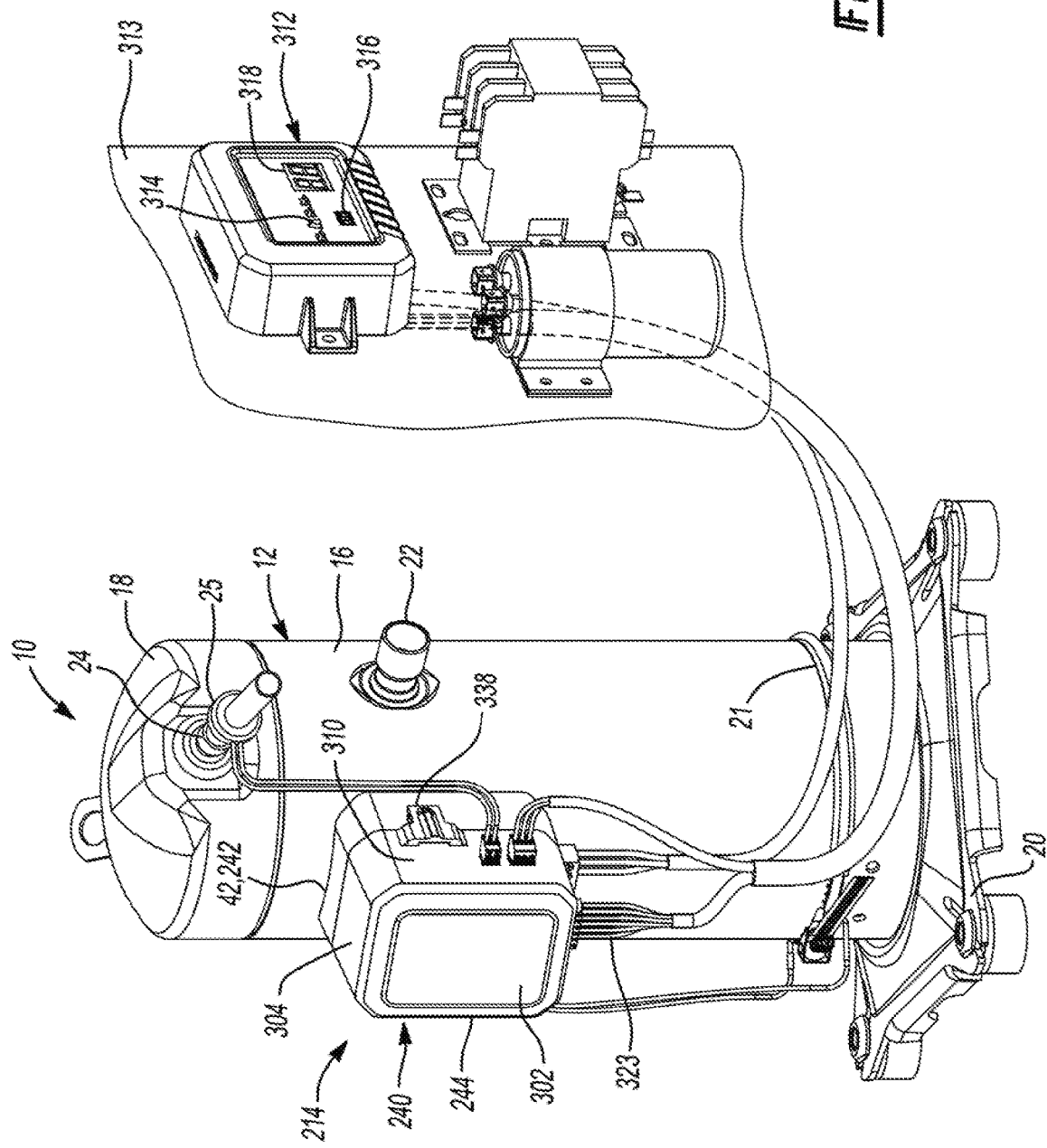
FIG. 6 is a perspective view of a compressor and another protection module having a remote display device according to the principles of the present disclosure.
Figure 7:
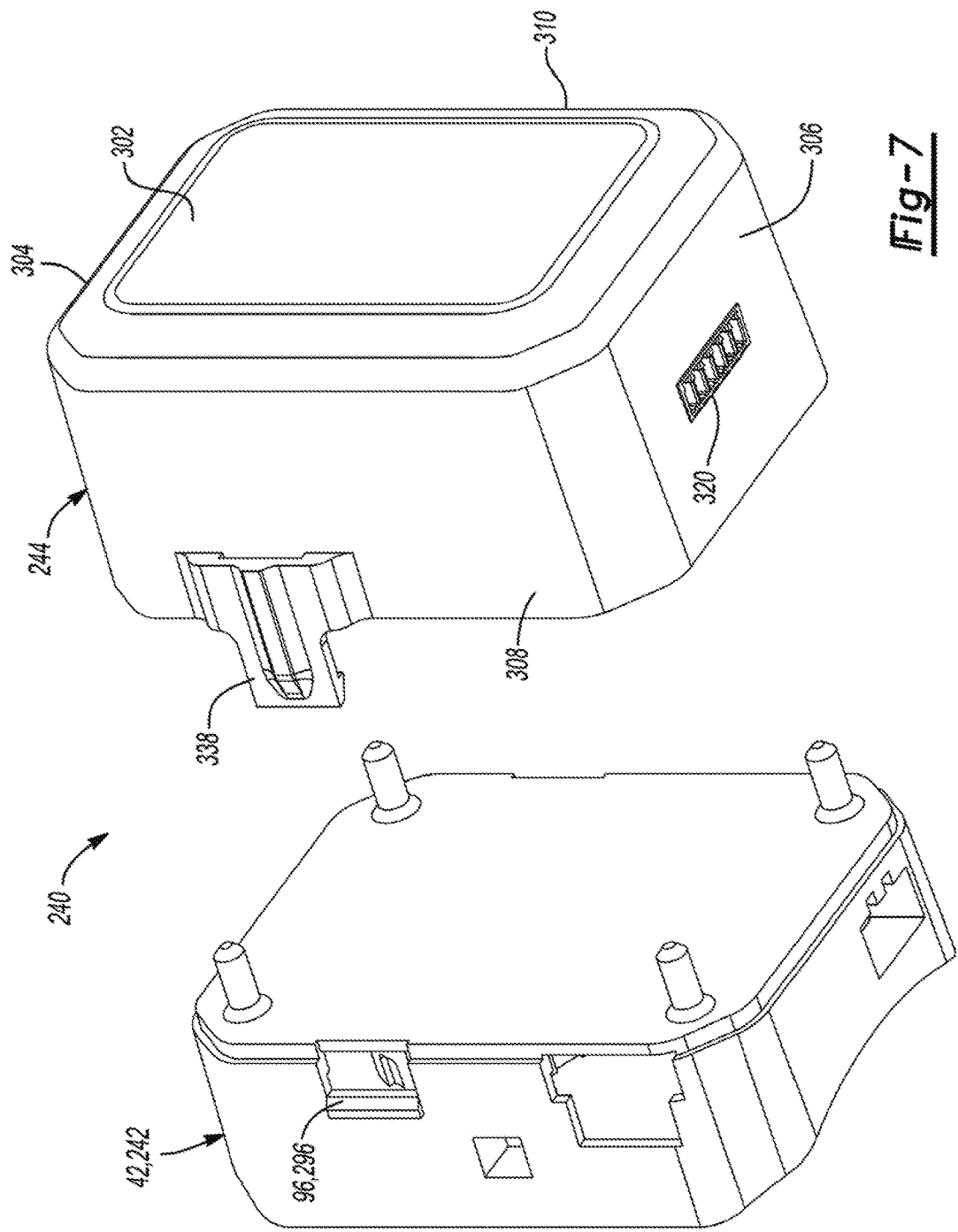
FIG. 7 is a partially exploded perspective view of a housing of the protection module of FIG. 6.

With reference to FIGS. 6 and 7, another protection module 214 is provided that may be substantially similar to the protection module 14 described above, apart from any exceptions noted below. The protection module 214 may be used in conjunction with the compressor 10 and the climate control system described above. The protection module 214 may include a housing 240 and a display device 312. The housing 240 may include protection and control electronics disposed therein. The structure and function of the housing 240, the display device 312 and protection and control electronics may be substantially similar to that of the housing 40, display device 112 and protection and control electronics, respectively, described above, apart from any exceptions noted below. Therefore, similar features will not be described again in detail.

Briefly, the housing 240 may include a base 242 and a cap 244. The base 242 may include a terminal plug (not shown) like the terminal plug 64 to engage and communicate with the terminal assembly 28 of the compressor 10. The base 242 can be substantially similar or identical to the base 42. In fact, the base 42 of the protection module 14 described above could be used in the protection module 214 with the cap 244. The cap 244 may include a body 302 and sidewalls 304, 306, 308, 310 that may be substantially similar to the body 102 and sidewalls 104, 106, 108, 110. The cap 244 may be removably secured to the base 42 or 242 in the manner described above. That is, the cap 244 may include resiliently flexible tabs 338 that engage tabs 96, 296 of the base 42, 242.

The display device 312 may be disposed in a remote location from the housing 240. For example, the display device 312 could be mounted to a panel or wall 313 of an outdoor unit (e.g., a condensing unit), as shown in FIG. 6. It will be appreciated that the display device 312 could be disposed at any other location that may be accessible to a service technician. Like the display device 112, the display device 312 may be in communication with the protection and control electronics and may display diagnostic information that a service technician may read and/or interpret when servicing or troubleshooting the compressor 10 and/or the climate control system. As shown in FIG. 6, the display device 312 may include one or more LED's 314, one or more communication ports 316 and a numeric or alpha-numeric display screen 318. The display device 312 may be in communication with the protection and control electronics via wires 323 coupled to a receptacle 320 (FIG. 7) in the cap 244 or the display device 312 may be in wireless communication with the protection and control electronics. The display device 312 may display indicia of compressor and/or climate control system operating conditions on the screen 318. Additionally, one or more of the LED's 314 may illuminate to indicate a particular fault or operating condition.

Figure 8:
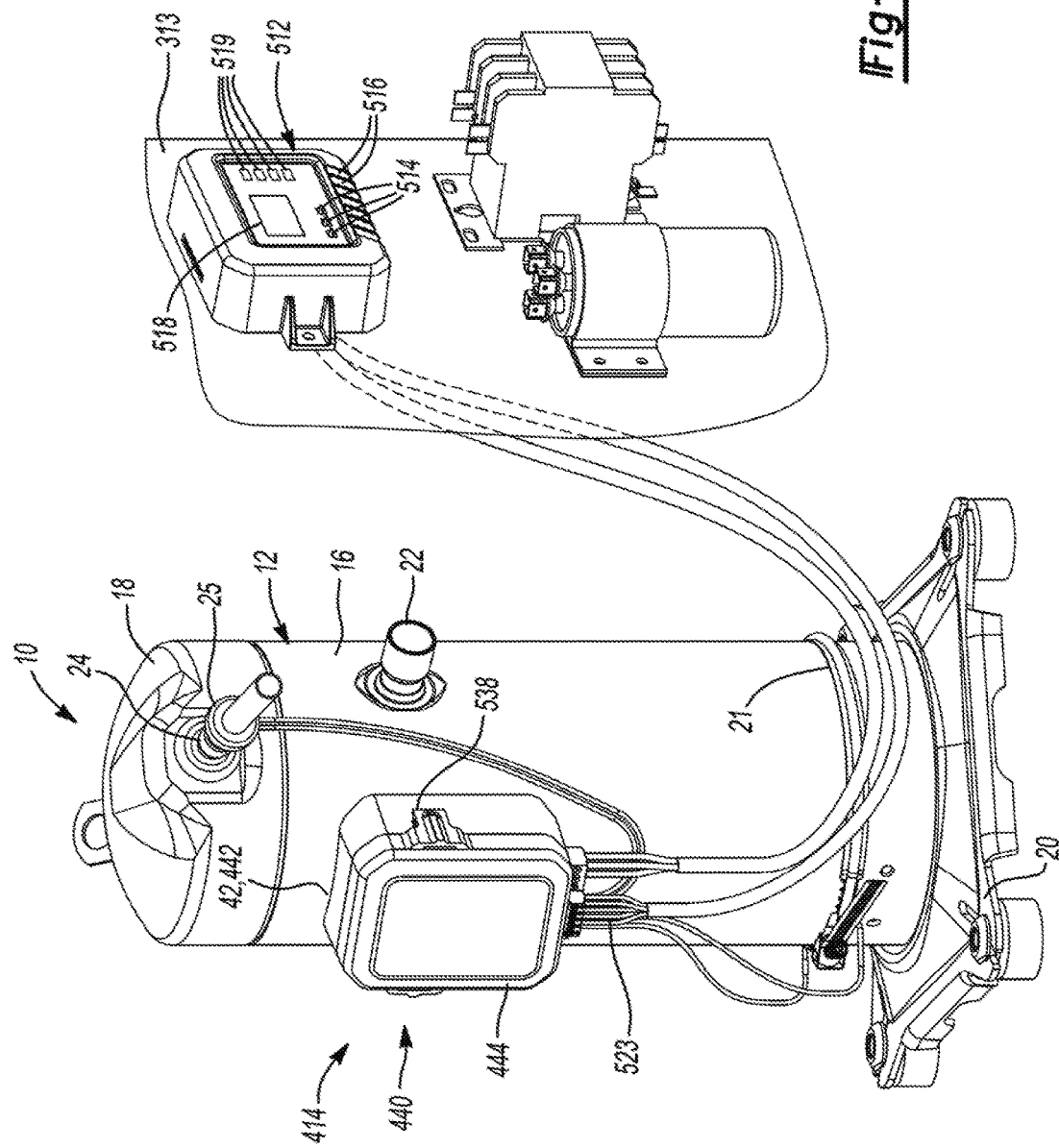
FIG. 8 is a perspective view of a compressor and yet another protection module having another remote display device according to the principles of the present disclosure.

With reference to FIGS. 7 and 8, another protection module 414 is provided that may be substantially similar to the protection modules 14, 214 described above, apart from any exceptions noted below. The protection module 414 may be used in conjunction with the compressor 10 and the climate control system described above. The protection module 414 may include a housing 440 and a display device 512. In some embodiments, the housing 440 may include protection and control electronics disposed therein. In some embodiments, the display device 512 may include the protection and control electronics disposed therein, and the housing 440 may house sensing and power electronics in communication with the protection and control electronics. The structure and function of the housing 440, the display device 512 and protection and control electronics may be generally similar to that of the housings 40, 240, display devices 112, 312 and protection and control electronics, respectively, described above, apart from any noted exceptions noted. Therefore, similar features will not be described again in detail.

Briefly, the housing 440 may include a base 442 and a cap 444. The base 442 can be substantially similar to the bases 42, 242. In fact, in some embodiments, the base 42 of the protection module 14 described above could be used in the protection module 414 with the cap 444. The cap 444 may be generally similar to the cap 244. The cap 444 may be removably secured to the base 42, 442 in the manner described above. That is, the cap 444 may include resiliently flexible tabs 538 that engage tabs 96, 496 of the base 42, 442. In some embodiments, the cap 444 may be thinner or otherwise smaller than the cap 44 due to protection, control and/or diagnostics boards being housed in the display device 512 rather than in the cap 444.

Figure 9:
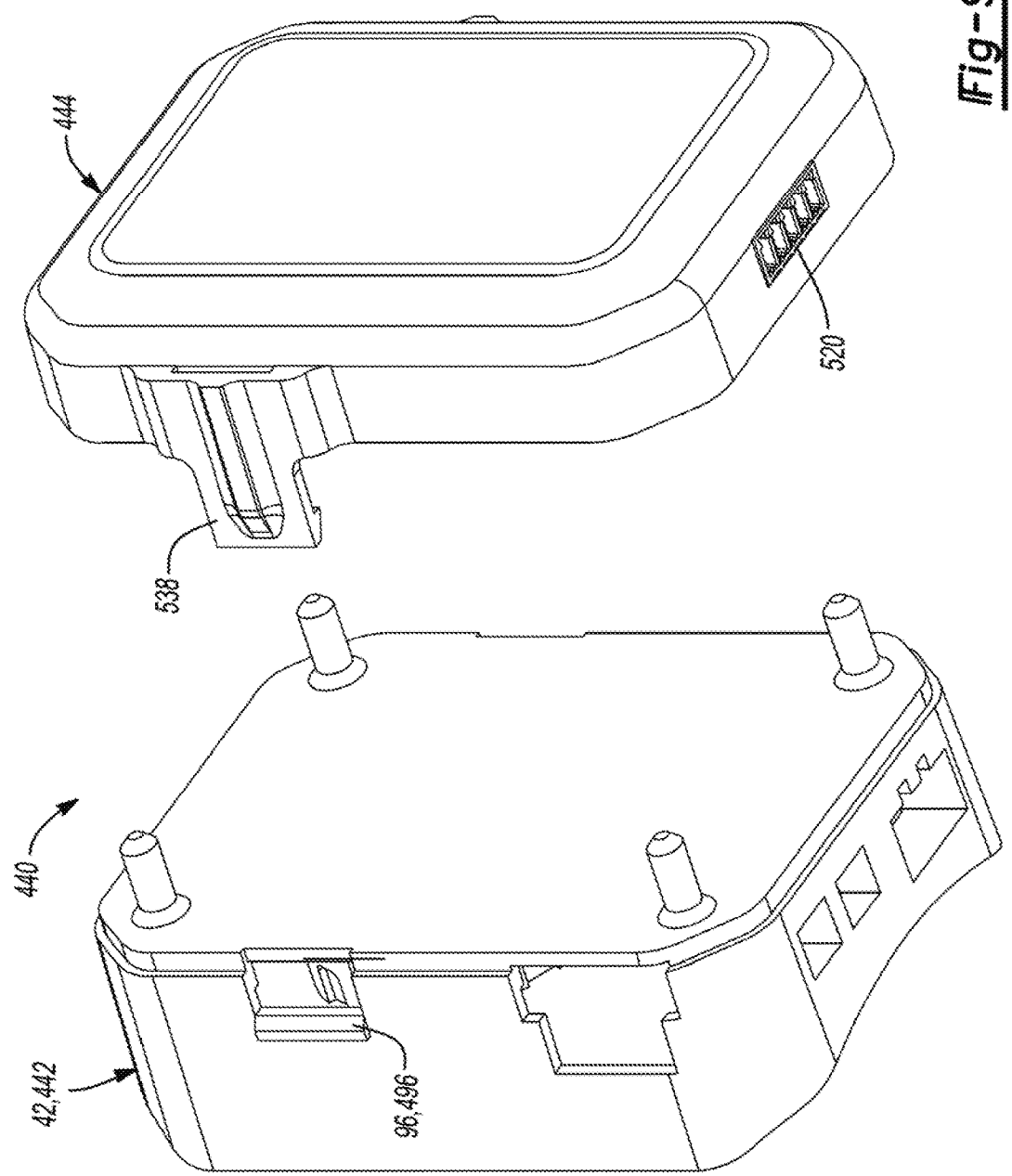
FIG. 9 is a partially exploded perspective view of a housing of the protection module of FIG. 8.
Figure 10:
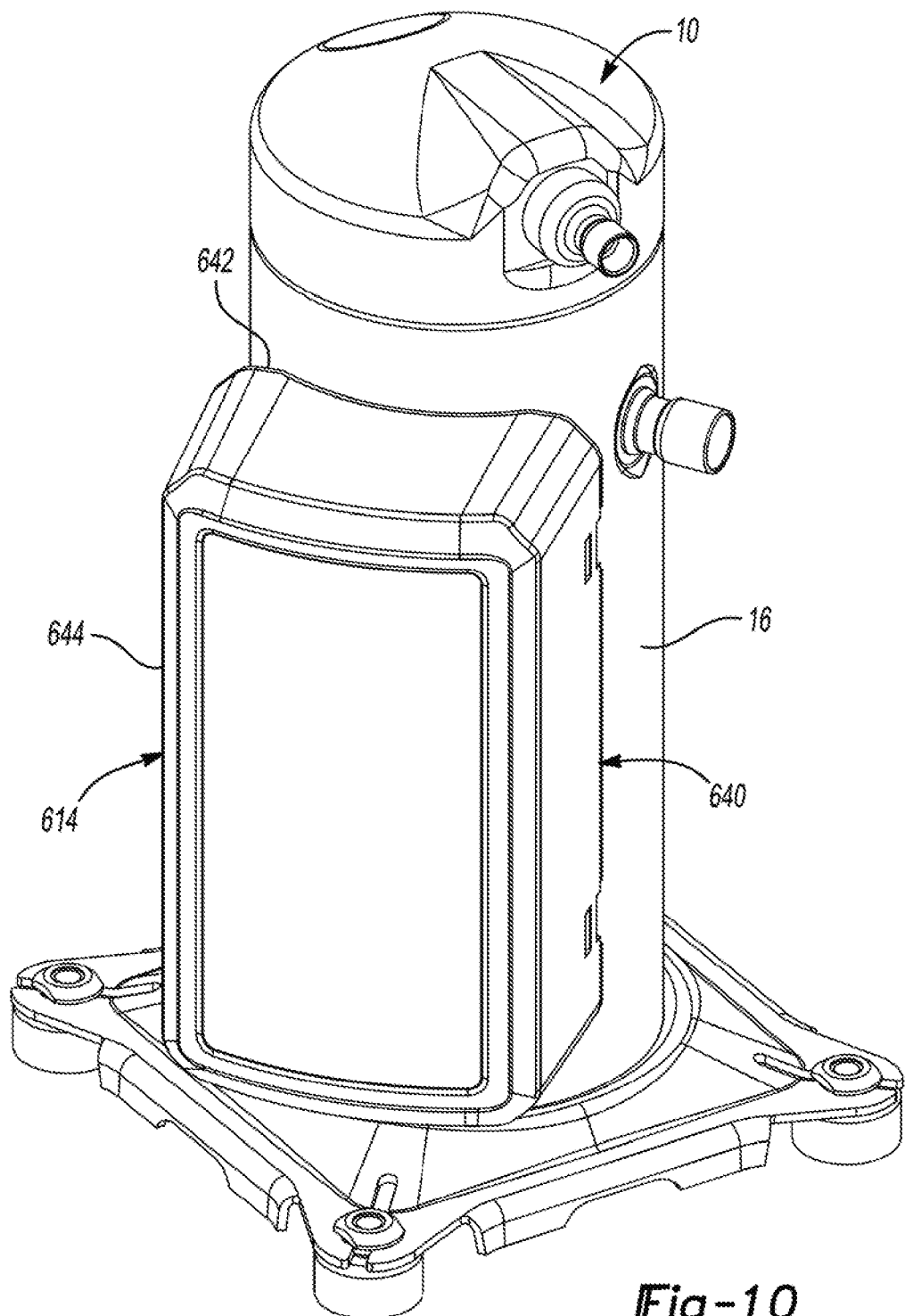
FIG. 10 is a perspective view of a compressor having an electronics module according to the principles of the present disclosure.

Like the display device 312, the display device 512 may be disposed remotely from the housing 440 and may be mounted to the wall 313 of the outdoor unit or any other suitable location. The display device 512 may be an interactive device and may include one or more LED's 514, one or more communication ports 516 (e.g., a network RS 485 port), an alpha-numeric screen 518 and a plurality of buttons 519. The screen 518 could be an LCD screen, for example. A service technician may use the buttons 519 and screen 518 to navigate through one or more menus to retrieve and display desired information or data (e.g., compressor and/or climate control system faults or operating conditions). The display device 512 may be in communication with the electronics in the housing 440 via wires 523 coupled to a receptacle 520 (FIG. 9) in the cap 444. In some embodiments, the display device 512 may be in wireless communication with electronics in the housing 440.

As described above, the base 42 (FIGS. 1 and 3-5) can be used with any of the protection modules 14, 214, 414. Therefore, a manufacturer of three different protection modules 14, 214, 414 could manufacture a single, common base 42 for use with all three of the protection modules 14, 214, 414. This reduces the number of components that the manufacturer would produce and keep in inventory in order to offer options of any of the various protection modules 14, 214, 414 to an end user.

For example, the manufacturer could provide the compressor 10 with the base 42 connected to the terminal assembly 28 and also provide two or more of the caps 44, 244, 444 in the manufacturer's inventory. One of the caps 44, 244, 444 could be selected for assembly onto the base 42 depending on system-level specifications (i.e., specifications for the climate control system) or an end user's specifications and/or depending on which of the display devices 112, 312, 512 is called for by the system-level specification or end user.

With reference to FIGS. 10-14, an electronics module 614 is provided that may be used in conjunction with the compressor 10 and the climate control system described above. The electronics module 614 may include a housing 640 in which electronic components (not shown) are provided to protect and control the compressor 10 and/or diagnose faults of the compressor 10 and/or faults of a climate control system in which the compressor 10 may be operating.

The housing 640 may include a base plate or back plate 642 and a cover 644. The back plate 642 may include a body 646 and a receptacle 648 that may be integrally formed with the body 646. As shown in FIG. 13, the body 646 may include a central portion 650 and outer portions 652. The central portion 650 may be curved around a portion of an outer circumference of the shell 16 of the compressor 10. As shown in FIGS. 11-13, the central portion 650 may include a spring element 654. The spring element 654 may abut the outer circumference of the shell 16 and, when compressed, may bias the back plate 642 away from the shell 16. The spring element 654 may be any suitable type of spring. For example, the spring element 654 could be integrally molded with the back plate 642 and may include a resiliently flexible strip of material that bulges outward from a first side 656 (FIGS. 12 and 13) of the back plate 642. When the first side 656 of the back plate 642 is pressed against the shell 16 with sufficient force, the spring element 654 will compress or flatten and exert a biasing force urging the back plate 642 away from the shell 16. It will be appreciated that the back plate 642 could include any other resiliently compressible member in addition to or instead of the spring element 654 such as a coil spring, a leaf spring, and/or a compressible foam, rubber or other elastomeric member, for example.

The outer portions 652 of the body 646 may be disposed on either side of the central portion 650 and may include a plurality of barbed, flexible tabs 658 (FIGS. 11, 13 and 14). The tabs 658 may snap into engagement with the cover 644 to removably secure the cover 644 to the back plate 642.

The receptacle 648 may be integrally formed with the central portion 650 of the body 646 and may be disposed between spring element 654 and an upper edge 660 of the central portion 650. The receptacle 648 may be a generally cylindrical body including an annular sidewall 662 and a generally planar backwall 664 that cooperate to define a generally cylindrical recess 666 (FIGS. 12 and 14). The recess 666 may include an open end 668 opposite the backwall 664. The sidewall 662 may extend outward from a second side 670 of the back plate 642. The sidewall 662 may include a plurality of flexible tabs 672 having barbs 674 (FIG. 14) extending inwardly therefrom. The tabs 672 may be flexible relative to the rest of the sidewall 662 so that the barbs 674 may snap into engagement with the apertures 38 of the terminal fence 36 when the terminal fence 36 is received into the recess 666, as shown in FIG. 14. In this manner, the tabs 672 may removably secure the back plate 642 to the terminal fence 36.

An opening 676 (FIG. 11) may extend through a portion of the sidewall 662 and a portion of the backwall 664. One or more apertures 678 and/or slots 680 may also be formed in the backwall 664. The opening 676 and the one or more apertures 678 and/or slots 680 (FIG. 11) may be in communication with the recess 666. Guide rails 682 (FIG. 14) may extend from the backwall 664 toward the open end 668 of the recess 666. Distal ends of the guide rails 682 may include a lip 686. A stop member 688 (FIG. 12) may extend between the guide rails 682.

A cluster block 690 can be inserted through the opening 676 and can be received between the guide rails 682 and between the lips 686 and the backwall 664, as shown in FIG. 14. The cluster block 690 may engage the conductor pins 34 of the terminal assembly 28 when the back plate 642 is attached to the compressor 10. The cluster block 690 may electrically couple the conductor pins 34 to corresponding electrical leads (not shown) of the electronic protection, control and/or diagnostic components of the electronics module 614. The cluster block 690 may also electrically isolate each of the conductor pins 34 from each other and may restrict or prevent moisture and/or other contaminants from contaminating the conductor pins 34.

As described above, the spring element 654 biases the back plate 642 away from the shell 16 of the compressor 10. This biasing force urges the barbs 674 of the tabs 672 of the receptacle 648 against edges of the apertures 38 in the terminal fence 36 of the compressor 10, thereby creating more friction between the barbs 674 and the edges of the apertures 38. This friction between the barbs 674 and the edges of the apertures 38 may provide a more secure engagement between the terminal fence 36 and the back plate 642 and inhibits or prevents inadvertent disengagement of the back plate 642 from the terminal fence 36 due to vibration of the compressor 10, for example.

Figure 15:
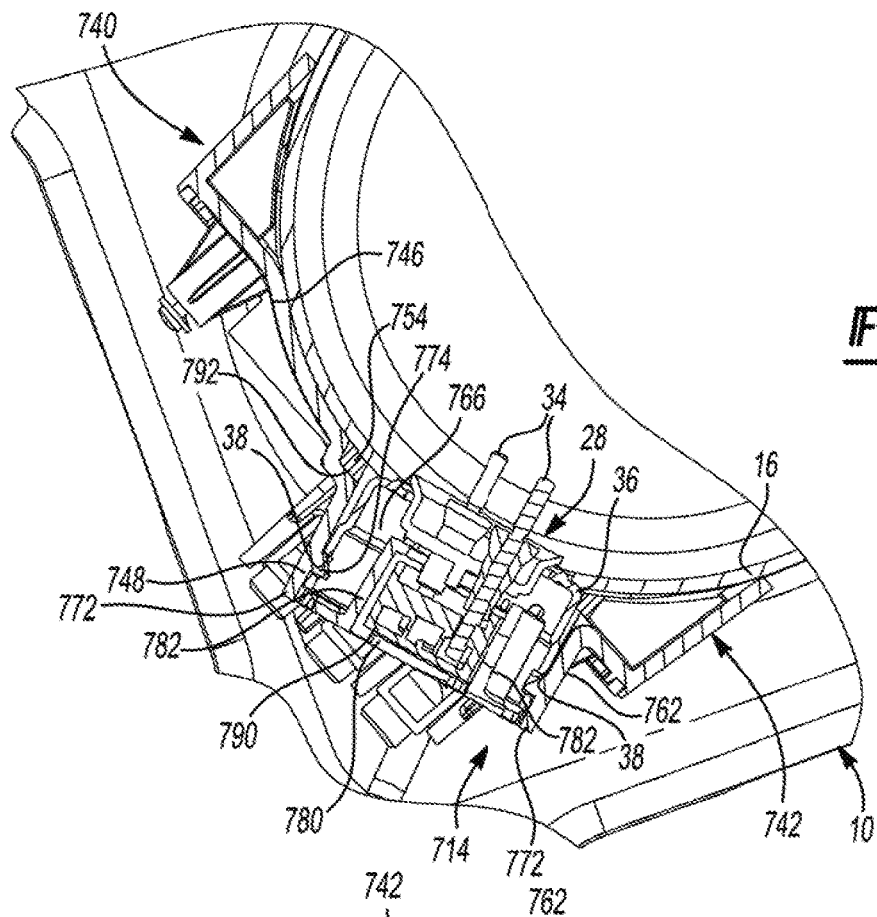
FIG. 15 is a partial cross-sectional view of the compressor and a back plate of another electronics module according to the principles of the present disclosure.
Figure 16:
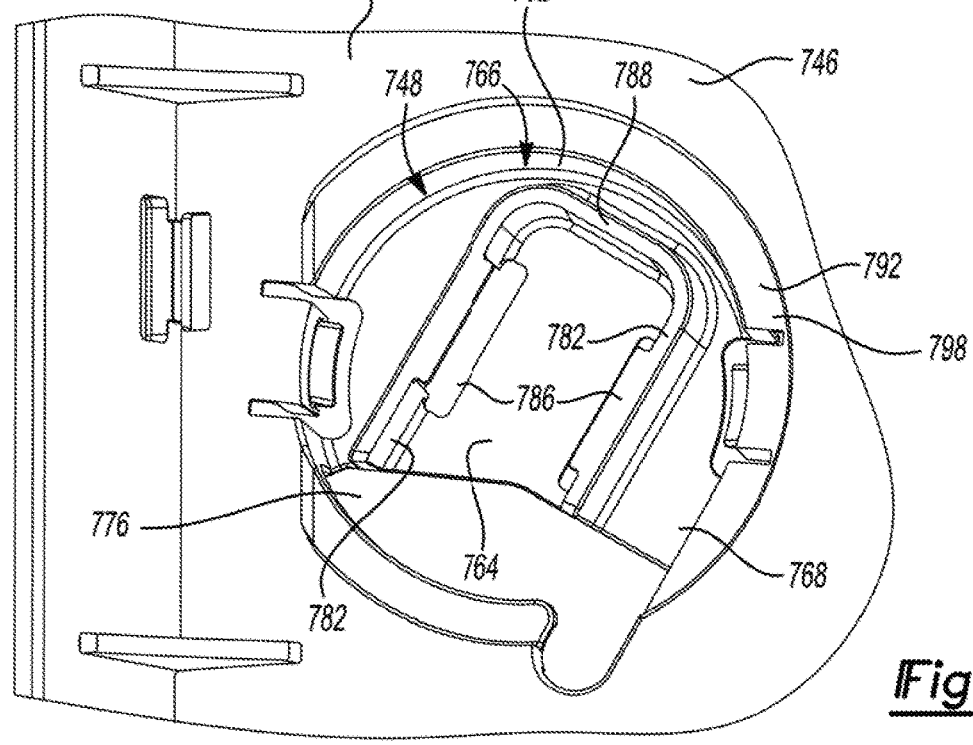
FIG. 16 is a partial perspective view of the back plate of FIG. 15.

Referring now to FIGS. 15 and 16, another electronics module 714 is provided that may be used in conjunction with the compressor 10 and the climate control system described above. The structure and function of the electronics module 714 may be similar to that of the electronics module 614 described above, apart from any exceptions described below and/or shown in the figures. Therefore, similar features may not be described again in detail.

Briefly, the electronics module 714 may include a housing 740 having a base plate or back plate 742 and a cover (not shown). The back plate 742 may include a body 746 and a receptacle 748 that may be integrally formed with the body 746.

The receptacle 748 may be a generally cylindrical body including an annular sidewall 762 and a generally planar backwall 764 that cooperate to define a generally cylindrical recess 766. The recess 766 may include an open end 768 opposite the backwall 764. The sidewall 762 may extend outward from the back plate 742 and may include a plurality of flexible tabs 772 having barbs 774 extending inwardly therefrom. The tabs 772 may be flexible relative to the rest of the sidewall 762 so that the barbs 774 may snap into engagement with the apertures 38 of the terminal fence 36 when the terminal fence 36 is received into the recess 766, as shown in FIG. 15. In this manner, the tabs 772 may removably secure the back plate 742 to the terminal fence 36. An opening 776 (FIG. 16) may extend through a portion of the sidewall 762 and a portion of the backwall 764. One or more slots 780 may also extend through the backwall 764. Guide rails 782 may extend from the backwall 764 toward the open end 768 of the recess 766. Distal ends of the guide rails 782 may include a lip 786. A stop member 788 (FIG. 16) may extend between the guide rails 782.

A cluster block 790 can be inserted through the opening 776 and can be received between the guide rails 782 and between the lips 786 and the backwall 764, as shown in FIG. 15. The cluster block 790 may engage the conductor pins 34 of the terminal assembly 28 when the back plate 742 is attached to the compressor 10.

As shown in FIG. 16, an annular recess 792 may be formed in the back plate 742 adjacent the open end 768 of the receptacle 748. The annular recess 792 may surround the open end 768 and may be generally concentric with the sidewall 762. As shown in FIG. 15, a spring element 754 may be partially received in the annular recess 792. The spring element 754 may be an annular body formed from a resiliently compressible polymeric or elastomeric material, such as EPDM (ethylene propylene diene monomer) or EPDM 4211N, for example.

When the back plate 742 is attached to the compressor 10, the spring element 754 may be compressed between an end 798 of the annular recess 792 and the shell 16 such that the spring element 754 surrounds the terminal fence 36. In this manner, the spring element 754 may seal against the shell 16 and the back plate 742 to restrict or prevent moisture and/or other contaminants from seeping into the receptacle 748 and/or accumulating on the terminal assembly 28. The spring element 754 may also provide a biasing force that urges the back plate 742 away from the shell 16. As described above, this biasing force urges the barbs 774 of the tabs 772 of the receptacle 748 against edges of the apertures 38 in the terminal fence 36 of the compressor 10, thereby creating more friction between the barbs 774 and the edges of the apertures 38. This friction between the barbs 774 and the edges of the apertures 38 may provide a more secure engagement between the terminal fence 36 and the back plate 742 and inhibits or prevents inadvertent disengagement of the back plate 742 from the terminal fence 36 due to vibration of the compressor 10, for example.

Figure 17:
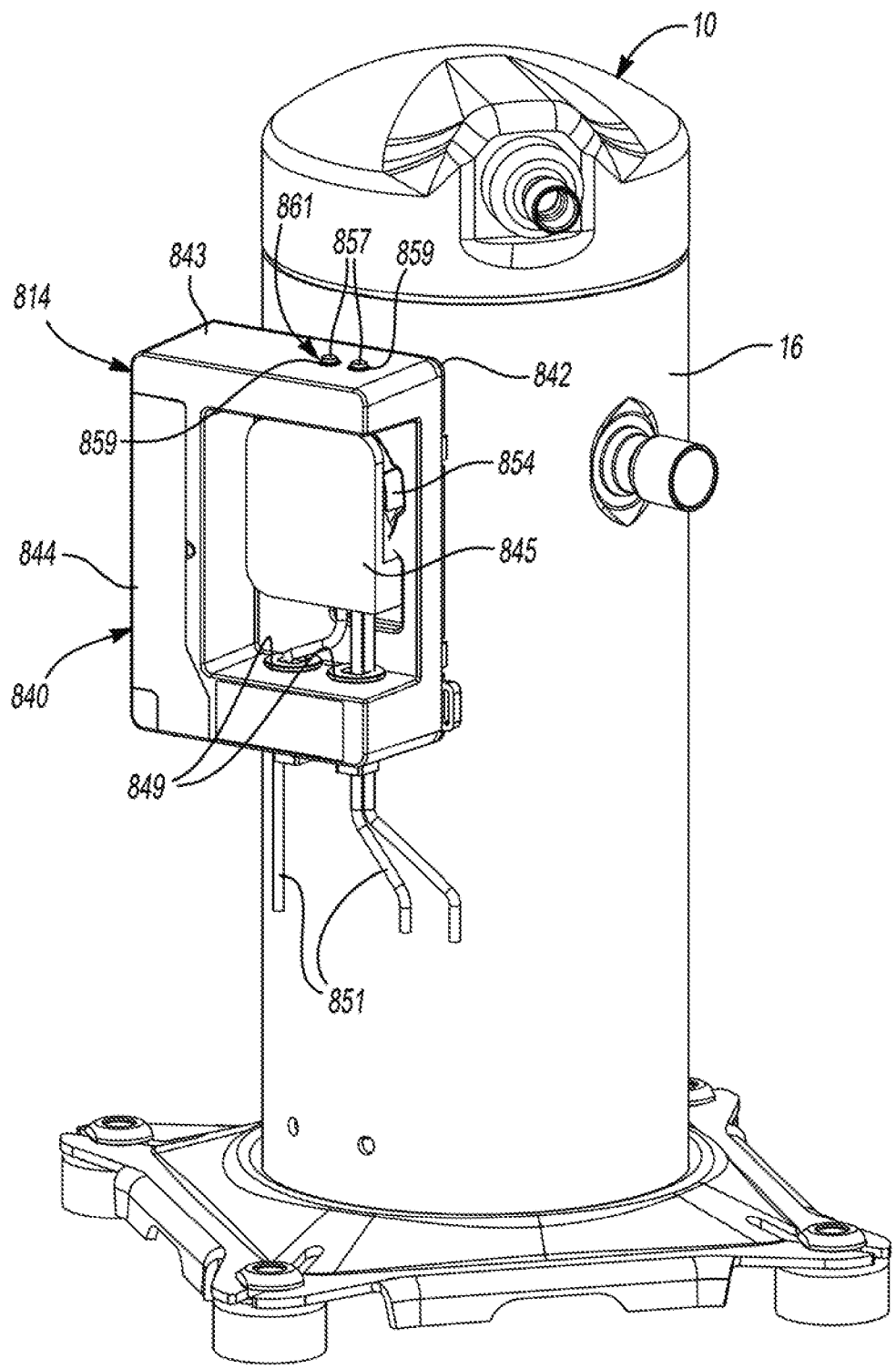
FIG. 17 is a perspective view of the compressor having another electronics module according to the principles of the present disclosure.
Figure 18:
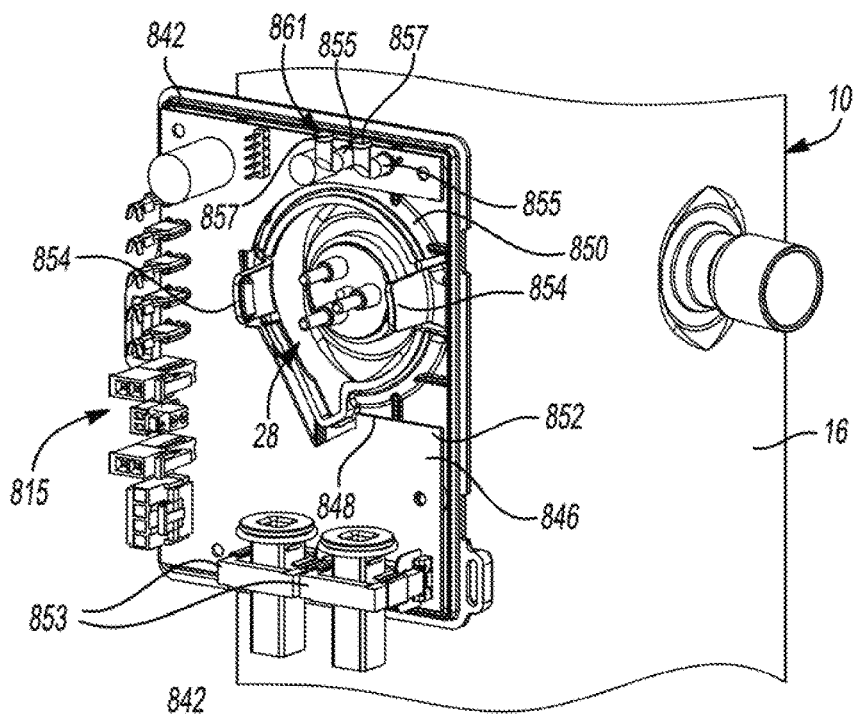
FIG. 18 is a partial perspective view of the compressor and a back plate of the electronics module of FIG. 17.
Figure 19:
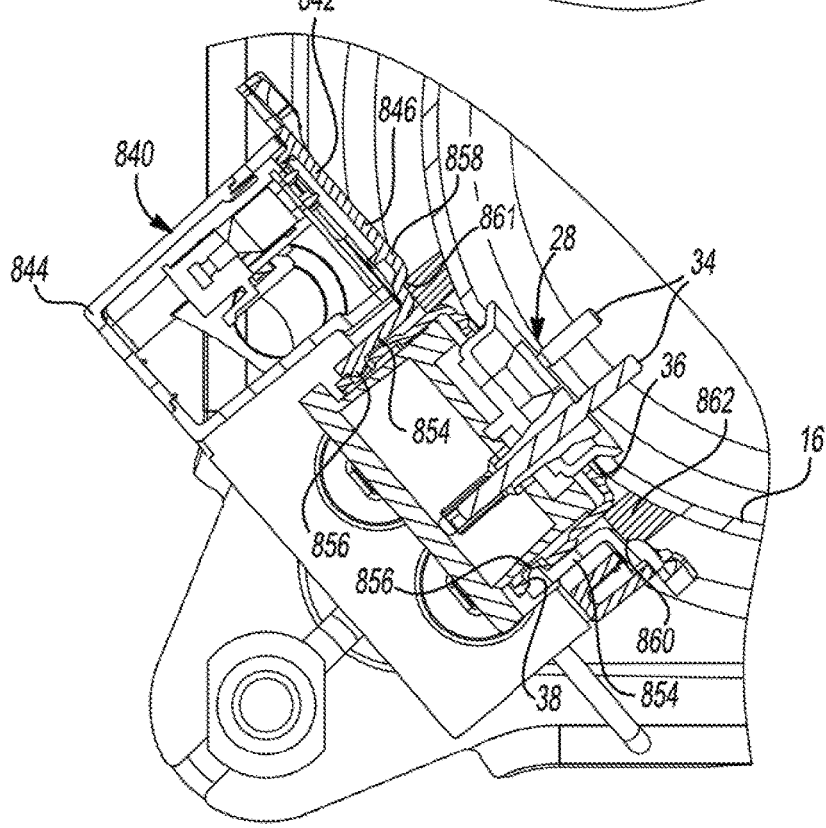
FIG. 19 is a partial cross-sectional view of the compressor and back plate of FIG. 18.

With reference to FIG. 17-19, another electronics module 814 is provided that may be used in conjunction with the compressor 10 and the climate control system described above. The electronics module 814 may include a housing 840 in which electronic components 815 (FIG. 18) are provided to protect and control the compressor 10 and/or diagnose faults of the compressor 10 and/or faults of a climate control system in which the compressor 10 may be operating.

The housing 840 may include a base plate or back plate 842 and a cover 844. The electronic components 815 can be mounted to the back plate 842 or the cover 844, for example. As will be subsequently described, the back plate 842 may engage the terminal fence 36 and may provide clearance for a molded plug 845 (FIG. 17) to be securely received within the terminal fence 36 for engagement with the conductor pins 34. The molded plug 845 may sealingly engage an inner diameter of the terminal fence 36 and may provide electrical communication between the conductor pins 34 and the electronic components 815 and/or other control, diagnostic and/or protection electronics (not shown) located remotely from the compressor 10. As shown in FIG. 17, the cover 844 may removably engage the back plate 842 and may include sleeves 849 through which wires 851 connected to the molded plug 845 may pass. The sleeves 849 may provide a sealing function to restrict water, dust and/or debris from entering a space between the back plate 842 and the cover 844. The sleeves 849 may also provide protection for current transformers 853 (FIG. 18) that may measure electrical current passing through at least one of the wires 851. Such current measurements may be used for the protection, diagnostics and/or control of the compressor 10 and/or the climate control system in which the compressor 10 may be operating.

Referring now to FIGS. 18 and 19, the back plate 842 may include a body 846 having an opening 848 extending therethrough. A collar 850 may extend outward from a first side 852 of the body 846 and may at least partially surround the opening 848. Flexible tabs 854 may be disposed adjacent the opening 848 and may extend outward from the first side 852. In some embodiments, the flexible tabs 854 could be integrally formed with the collar 850. The tabs 854 may include inwardly facing barbs 856. A second side 858 of the body 846 may include an annular recess 860 (FIG. 19) that may at least partially surround the opening 848. As shown in FIG. 19, an annular spring element 862 may be partially received in the recess 860. The spring element 862 may be substantially similar to the spring element 754, for example, and may be an annular body formed from a resiliently compressible polymeric or elastomeric material, such as EPDM or EPDM 4211N, for example.

When the back plate 842 is connected to the compressor 10, the terminal fence 36 may extend through the opening 848 and the barbs 856 of the tabs 854 may snap into engagement with the apertures 38 in the terminal fence 36. When the barbs 856 are engaged with the apertures 38, the spring element 862 may surround the terminal fence 36 and may be compressed between an end 861 of the recess 860 and the shell 16. In this manner, the spring element 862 may seal against the shell 16 and the back plate 842 to restrict or prevent moisture and/or other contaminants from seeping into the opening 848 and/or accumulating on the terminal assembly 28. The spring element 862 may also provide a biasing force that urges the back plate 842 away from the shell 16. As described above, this biasing force urges the barbs 856 of the tabs 854 against the edges of the apertures 38 in the terminal fence 36 of the compressor 10, thereby creating more friction between the barbs 856 and the edges of the apertures 38. This friction between the barbs 856 and the edges of the apertures 38 may provide a more secure engagement between the terminal fence 36 and the back plate 842 and inhibits or prevents inadvertent disengagement of the back plate 842 from the terminal fence 36 due to vibration of the compressor 10, for example.

While the spring elements 754, 862 are described above as being a resiliently compressible polymeric or elastomeric gasket, in some embodiments, the spring elements 754, 862 could be or include a coil spring or any other type of spring member. In some embodiments, the back plates 742, 842 may include a spring element similar to the spring element 654 described above in addition to or in the alternative to the spring elements 754, 862. It will be appreciated that the electronics module 614 may also include a spring element and/or gasket similar to the spring elements 754, 862.

The electronic components 815 (shown in FIG. 18) may include a plurality of indicator assemblies 861 each having a light emitting diode (LED) 855 and a light pipe 857. Each LED 855 may be an indicator of a fault code, a status of the compressor 10 or a status of the climate control system, for example. Each LED 855 may be adjacent a corresponding one of the light pipes 857. The light pipes 857 may extend through apertures 859 (FIG. 17) formed in a top end 843 of the cover 844. The light pipes 857 may transmit the light from LEDs 855 to be visible from the top of electronics module 814. While the figures depict two indicator assemblies 861, the electronics module 814 may include any other number of indicator assemblies 861.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A compressor comprising:
   a shell;
   a terminal assembly engaging said shell and including an outwardly extending conductor and a terminal fence at least partially surrounding said conductor; and
   an electronics module including a back plate having an opening through which said terminal fence is received, said back plate including an engagement feature and a spring element, said engagement feature removably engaging said terminal fence, said spring element contacting said shell and biasing said back plate away from said shell.

2. The compressor of claim 1, wherein said spring element includes a resiliently compressible annular gasket.

3. The compressor of claim 2, wherein said annular gasket seals against said shell and said back plate.

4. The compressor of claim 1, wherein said spring element includes a strip integrally formed with said back plate and bulging outward therefrom toward said shell.

5. The compressor of claim 1, wherein said terminal fence includes a plurality of apertures, and said engagement feature includes a plurality of flexible tabs having barbs engaging said apertures.

6. The compressor of claim 5, wherein said spring element biases said barbs into engagement with edges of said apertures.

7. The compressor of claim 5, wherein said terminal fence is received between said tabs.

8. The compressor of claim 1, wherein said back plate includes a receptacle including guide rails engaging a cluster block that is electrically connected to said conductor.

9. The compressor of claim 8, wherein said receptacle includes an opening through which said cluster block is removably received.

10. A compressor comprising:
    a shell;
    a terminal assembly engaging said shell and including an outwardly extending conductor and a terminal fence at least partially surrounding said conductor; and
    an electronics module including a back plate having an opening through which said terminal fence is received, said back plate including a receptacle and an engagement feature, said receptacle receiving said terminal fence and including guide rails removably engaging a cluster block that is electrically connected to said conductor, said engagement feature removably engaging said terminal fence.

11. The compressor of claim 10, wherein said back plate include a spring element contacting said shell and biasing said back plate away from said shell.

12. The compressor of claim 11, wherein said spring element includes a resiliently compressible annular gasket.

13. The compressor of claim 12, wherein said annular gasket seals against said shell and said back plate.

14. The compressor of claim 11, wherein said spring element includes a strip integrally formed with said back plate and bulging outward therefrom toward said shell.

15. The compressor of claim 11, wherein said terminal fence includes a plurality of apertures, and said engagement feature includes a plurality of flexible tabs having barbs engaging said apertures.

16. The compressor of claim 15, wherein said spring element biases said barbs into engagement with edges of said apertures.

17. The compressor of claim 15, wherein said terminal fence is received between said tabs.

18. The compressor of claim 10, wherein said back plate includes a receptacle supporting said guide rails.

19. The compressor of claim 18, wherein said receptacle includes an opening through which said cluster block is removably received.

20. The compressor of claim 3, wherein said back plate includes an annular recess at least partially surrounding said opening, and wherein said annular gasket is at least partially received in said annular recess.

21. The compressor of claim 1, further comprising a molded plug engaging said terminal fence and engaging said conductor for electrical communication between said conductor and said molded plug.

22. The compressor of claim 21, wherein said terminal fence includes a plurality of apertures, and said flexible tabs include barbs engaging said apertures, wherein said spring element biases said barbs into engagement with edges of said apertures, wherein said terminal fence is received between said flexible tabs, and wherein said molded plug is received within said terminal fence.

23. The compressor of claim 21, wherein said electronics module includes a cover removably attached to said back plate, and wherein said back plate and said cover cooperate to form an enclosure in which a plurality of electronic components are disposed.

24. The compressor of claim 23, wherein said electronics module includes one or more indicator lights extending through one or more apertures formed in said cover.

25. The compressor of claim 23, wherein said cover includes a plurality of sleeves through which wires connected to said molded plug extend.

26. The compressor of claim 25, wherein said sleeves and said wires extend through current transformers disposed between said cover and said back plate.

27. The compressor of claim 23, wherein said cover includes a recess in which said molded plug is disposed.

28. The compressor of claim 27, wherein said molded plug is disposed outside of said enclosure formed by said back plate and said cover.

* * * * *